(12) United States Patent
Kim et al.

(10) Patent No.: US 11,073,914 B2
(45) Date of Patent: Jul. 27, 2021

(54) VIBRATION GENERATION DEVICE, AND DISPLAY APPARATUS AND VEHICLE COMPRISING THE SAME

(71) Applicant: LG Display Co., Ltd., Seoul (KR)

(72) Inventors: Chiwan Kim, Gyeonggi-do (KR); Taeheon Kim, Seoul (KR); Sung-Eui Shin, Seoul (KR); YongWoo Lee, Gyeonggi-do (KR); Kyungyeol Ryu, Gyeonggi-do (KR); YuSeon Kho, Seoul (KR); YongGyoon Jang, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/720,587

(22) Filed: Dec. 19, 2019

(65) Prior Publication Data
US 2020/0209973 A1 Jul. 2, 2020

(30) Foreign Application Priority Data

Dec. 28, 2018 (KR) .................. 10-2018-0172285
Nov. 19, 2019 (KR) .................. 10-2019-0148672

(51) Int. Cl.
| | |
|---|---|
| *G06F 3/01* | (2006.01) |
| *H01L 27/32* | (2006.01) |
| *G02F 1/1368* | (2006.01) |
| *G02F 1/1333* | (2006.01) |
| *G06F 3/041* | (2006.01) |
| *B60K 37/04* | (2006.01) |
| *B06B 1/06* | (2006.01) |
| *G06F 3/044* | (2006.01) |

(Continued)

(52) U.S. Cl.
CPC ............ *G06F 3/016* (2013.01); *B06B 1/0688* (2013.01); *B60K 37/04* (2013.01); *G02F 1/1368* (2013.01); *G02F 1/13338* (2013.01); *G06F 3/0416* (2013.01); *H01L 27/323* (2013.01); *H01L 27/3244* (2013.01); *B60K 2370/1438* (2019.05); *B60K 2370/152* (2019.05); *B60K 2370/158* (2019.05); *B60K 2370/77* (2019.05); *B60R 11/0217* (2013.01); *B60R 2011/0005* (2013.01); *B60R 2011/0021* (2013.01); *G06F 3/0443* (2019.05)

(58) Field of Classification Search
None
See application file for complete search history.

(56) References Cited

U.S. PATENT DOCUMENTS

| | | | | |
|---|---|---|---|---|
| 2001/0050514 | A1* | 12/2001 | Gururaja ............... | H01L 41/317 310/320 |
| 2014/0198072 | A1* | 7/2014 | Schuele .................. | G06F 3/043 345/174 |

(Continued)

*Primary Examiner* — Matthew Yeung
(74) *Attorney, Agent, or Firm* — Morgan, Lewis & Bockius LLP

(57) ABSTRACT

The present disclosure relates to a vibration generation device, a display apparatus including the vibration generation device, and a vehicle including the vibration generation device. A vibration generation device includes a piezoelectric ceramic part having a certain interval, a piezoelectric material layer between the piezoelectric ceramic parts, and an electrode part configured to provide electric field to one or more of the piezoelectric ceramic part and the piezoelectric material layer.

37 Claims, 29 Drawing Sheets

(51) Int. Cl.
    *B60R 11/02*        (2006.01)
    *B60R 11/00*        (2006.01)

(56) References Cited

U.S. PATENT DOCUMENTS

2016/0187985 A1*  6/2016  Lim .................... G06F 3/0412
                                                    345/173
2017/0155035 A1*  6/2017  Matsuda ............. H04N 5/2328
2017/0228020 A1*  8/2017  Hashimoto ........ H03K 17/9622

\* cited by examiner

VIBRATION GENERATION DEVICE, AND DISPLAY APPARATUS AND VEHICLE COMPRISING THE SAME

CROSS REFERENCE TO RELATED APPLICATION

This application claims the benefit of and priority to Korean Patent Application No. 10-2018-0177285, filed on Dec. 28, 2018 and No. 10-2019-0148672, filed on Nov. 19, 2019, the contents of which are hereby incorporated by reference in its entirety as if fully set forth herein.

BACKGROUND

Technical Field

The present disclosure relates to a vibration generation device, and a display apparatus and a vehicle including the vibration generation device. More specifically, the present disclosure relates to a vibration generation device with piezoelectric vibration characteristics and light transmission characteristics, and a display apparatus and a vehicle each including the vibration generation device.

Discussion of the Related Art

A display apparatus may be mounted or integrated in electronic apparatuses or home appliances, such as a television, a monitor, a notebook computer, a smart phone, a tablet computer, an electronic pad, a wearable apparatus, a watch phone, a portable information apparatus, a navigation apparatus, a vehicle control display apparatus, and the like and used for displaying an image.

The display apparatus may include a display panel for displaying images or video, and an audio device for providing sound.

However, the audio device is sometimes disposed on the rear surface of the display panel, resulting in sound from the audio device traveling backward or downward of the display panel. This causes sound quality to be degraded and the immersion experience of a user or a viewer to be reduced due to interference between sound waves reflected from a structure or a thing existing in nature in the vicinity, such as a wall, the ground, or the like.

Haptic effects may be provided to apparatuses including a display panel, such as a mobile communication terminal, a portable information apparatus, a vehicle control display apparatus, or the like, in order to provide feedback or notifications to a user by vibrating a part or all of a display screen of the display panel in response to a user's manipulation, such as a touch input.

A piezoelectric actuator using a piezoelectric material generating mechanical energy such as vibration in response to an electrical signal may be used to provide haptic effects to display apparatuses; it is therefore desirable to provide a method of applying such a piezoelectric actuator to the display apparatus. Further, in order to improve the visibility of the display apparatus, it is desired to control a path of light emitted from the display apparatus.

However, in a situation where the audio device is disposed on the rear surface of the display panel, it is problematic to provide vibration acceleration for a desired haptic feedback or vibration characteristic due to components included in the display apparatus or a structure thereof.

SUMMARY

Accordingly, embodiments of the present disclosure are directed to vibration generation devices and display apparatuses including a vibration generation device that substantially obviate one or more problems due to limitations and disadvantages of the related art.

In accordance with an aspect of the present disclosure, there are provided a vibration generation device which is capable of providing vibration acceleration by being disposed in the front surface of a display apparatus and which has a light control function, and a display apparatus including the vibration generation device.

In accordance with another aspect of the present disclosure, there is provided a display apparatus capable of providing haptic effects and a light control function by disposing, on the front surface of the display apparatus, a vibration generation device including a transparent piezoelectric material, an opaque piezoelectric ceramic material, and an electrode structure.

In accordance with a further aspect of the present disclosure, there are provided a vibration generation device including a plurality of piezoelectric ceramic parts spaced apart from one another, having a predetermined pitch, and extending in a first direction with a first width and a first thickness, an electrode part including a first electrode located on a first surface of at least one of the piezoelectric ceramic parts and a second electrode located on a second surface of at least one of the piezoelectric ceramic parts, and a piezoelectric material layer between the plurality of piezoelectric ceramic parts, a display apparatus including the vibration generation device, and a vehicle including the vibration generation device.

In accordance with a further aspect of the present disclosure, there are provided a vibration generation device including a piezoelectric ceramic part including a plurality of piezoelectric ceramic lattices with a predetermined width, a piezoelectric material layer disposed inside at least one of the piezoelectric ceramic lattices of the piezoelectric ceramic part, and an electrode part including a first electrode and a second electrode disposed on an upper surface and a lower surface of the piezoelectric ceramic part and the piezoelectric material layer, respectively, a display apparatus including the vibration generation device, and a vehicle including the vibration generation device. In this case, the first electrode and the second electrode may be disposed in all or at least one portion of the upper surface and the lower surface, respectively.

In accordance with a further aspect of the present disclosure, there is provided a liquid crystal display apparatus including a vibration generation device disposed either between a backlight and a liquid crystal display panel which are included in the liquid crystal display apparatus, or in an upper portion of the liquid crystal display panel.

In accordance with a further aspect of the present disclosure, there is provided an organic light emitting display apparatus in which a vibration generation device is disposed on the front surface or the rear surface of the organic light emitting display panel.

In accordance with a further aspect of the present disclosure, there are provided a display apparatus with improved sound performance and sound pressure characteristics, and a vehicle including the display apparatus.

When a user watches images from a display panel in front of a corresponding display apparatus, a direction in which sound from the display apparatus travels to the user may be the front of the display panel. Taking into this account, the present inventors conducted experiments to improve sound quality. Through several and various experiments, the inventors invented a display apparatus with a new structure in which sound from the display apparatus can travel toward the front of a display panel, and improved sound quality and desired vibration can be provided.

In accordance with a further aspect of the present disclosure, there are provided a display apparatus capable of causing sound from the display apparatus to travel toward the front of a display panel, and a vehicle including the display apparatus.

In accordance with a further aspect of the present disclosure, there are provided a vibration generation device capable of improving sound quality and increasing the immersion experience of a user or a viewer, a display apparatus including the vibration generation device, and a vehicle including the vibration generation device.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

In accordance with an embodiment of the present disclosure, there is provided a vibration generation device comprising: a piezoelectric ceramic part having a predetermined width, a piezoelectric material layer between at least two piezoelectric ceramic parts, and an electrode part configured to provide an electric field to one or more of the piezoelectric ceramic part and the piezoelectric material layer.

In accordance with another embodiment of the present disclosure, there is provided a display apparatus comprising: a liquid crystal display panel including a thin film transistor substrate, a backlight configured to provide backlight to the liquid crystal display panel, and a vibration generation device including a piezoelectric ceramic part which is disposed in at least one or more of between the backlight and the liquid crystal display panel, on an upper surface of the liquid crystal display panel, and on a lower surface of the liquid crystal display panel, and the vibration generation device includes a piezoelectric ceramic part arranged having interval, a piezoelectric material layer between at least two piezoelectric ceramic parts, and an electrode part configured to provide an electric field to at least one or more of the piezoelectric ceramic part and the piezoelectric material layer.

In accordance with another embodiment of the present disclosure, there is provided a display apparatus comprising: an organic light emitting display panel including a thin film transistor substrate, a vibration generation device including a piezoelectric ceramic part in the organic light emitting display panel and disposed to have a certain interval, a piezoelectric material layer d between at least two piezoelectric ceramic parts, and an electrode part configured to provide an electric field to at least one of the piezoelectric ceramic part and the piezoelectric material layer.

In accordance with another embodiment of the present disclosure, there is provided a display apparatus comprising: a display panel configured to display an image, and a vibration generation device in the display panel, the vibration generation device including a plurality of first portions having piezoelectric characteristics, a plurality of second portions between the plurality of first portions, and at least one electrode over the plurality of first portions and the plurality of second portions.

In accordance with another embodiment of the present disclosure, there is provided a vehicle comprising: a dashboard including a first region facing a driver seat, a second region facing a passenger seat, and a third region between the first region and the second region, an instrument panel module including a first display in the first region of the dashboard, an infotainment module including at least one of a second display in the third region of the dashboard, a third display in the second region of the dashboard, a fourth display on a rear surface of the driver seat, and a fifth display on a rear surface of the passenger seat, the at least one of the first to fifth displays includes a display apparatus having a vibration generation device, the vibration generation device comprises a plurality of first portions having piezoelectric characteristics, a plurality of second portions between the plurality of first portions, and an electrode over at least one of the plurality of first portions and the plurality of second portions.

In accordance with embodiments of the present disclosure, since a vibration generation device including a piezoelectric material layer is disposed on an inner surface or a front surface of a display apparatus, it is possible to provide vibration acceleration through a surface of the display apparatus and perform a light control function for controlling a path of light emitted from the display apparatus.

In accordance with embodiments of the present disclosure, it is possible to provide a display apparatus capable of providing haptic effects and a light control function by disposing, in the display apparatus, a vibration generation device including a transparent piezoelectric material, an opaque piezoelectric ceramic material, and an electrode structure.

In accordance with embodiments of the present disclosure, since a vibration generation device capable of providing haptic effects and a light control function is employed in a display apparatus, it is possible improve the visibility of the display apparatus by controlling a path of light emitted from the display apparatus and minimizing reflection of light from a structure of the display apparatus or a thing existing in the vicinity.

In accordance with embodiments of the present disclosure, since sound can be output toward the front of a display panel, and sound with improved sound quality, sound performance, and sound pressure can be output, it is possible improve the immersion experience of a user or a viewer.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles of the disclosure.

Figure 1A:
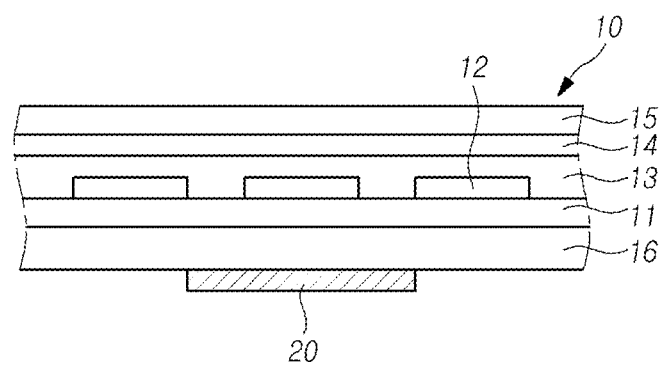
FIGS. 1A and 1B are views illustrating a display apparatus in accordance with an embodiment of the present disclosure.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to the exemplary embodiments of the present disclosure, examples of which may be illustrated in the accompanying drawings. In the following description, when a detailed description of well-known functions or configurations related to this document is determined to unnecessarily cloud a gist of the inventive concept, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a particular order. Like reference numerals designate like elements throughout. Names of the respective elements used in the following explanations are selected only for convenience of writing the specification and may be thus different from those used in actual products.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Furthermore, the present disclosure is only defined by scopes of claims.

In addition, the shapes, sizes, ratios, angles, numbers, and the like illustrated in the drawings for describing embodiments of the present disclosure are merely examples, and thus, the present disclosure is not limited thereto. Like reference numerals refer to like elements throughout. In the following description, when the detailed description of the relevant known technology is determined to unnecessarily obscure the important point of the present disclosure, the detailed description will be omitted.

The terms, such as "including," "having," "containing," "comprising of," "consist of," or the like, used herein are generally intended to allow other components to be added unless the terms are used with the term "only". Singular forms used herein are intended to include plural forms unless the context clearly indicates otherwise.

In interpreting any elements or features of the embodiments of the present disclosure, it should be considered that any dimensions and relative sizes of layers, areas and regions include a tolerance or error range even when a specific description is not conducted.

Spatially relative terms, such as "on," "over," "above," "below," "under," "beneath," "lower," "upper," "near," "close," "adjacent," or the like, used herein to describe one element or feature's relationship to another element(s) or feature(s) are generally intended to allow one or more additional elements to be interposed between the elements unless the terms, such as "directly," "immediately," or the like, are used.

Time relative terms, such as "after," "subsequent to," "next," "before," or the like, used herein to describe a temporal relationship between events, operations, or the like are generally intended to include events, cases, operations, or the like that do not occur consecutively unless the terms, such as "directly," "immediately," or the like, are used.

When the terms, such as "first," "second," or the like, are used herein to describe various elements or components, it should be considered that these elements or components are not limited thereto. These terms are merely used herein for distinguishing an element from other elements. Therefore, a first element mentioned below may be a second element in a technical concept of the present disclosure.

The terms, such as "first," "second," "A," "B," "(A)," or "(B)" may be used herein to describe one or more elements of the disclosure. Each of the terms is not used to define essence, order, sequence, or number of an element, but is used merely to distinguish the corresponding element from another element. When it is mentioned that an element is "connected" or "coupled" to or"contacts" another element, it should be understood that an additional element may be interposed between the elements or the elements may be connected or coupled to or contact each other indirectly, as well as that the one element is connected or coupled to or contacts the another element directly, unless the context clearly indicates otherwise.

It should be understood that the term "at least one" used herein can include all combinations obtained by combining one or more associated elements. For example, "at least one of a first element, a second element, and a third element" can include all combinations obtained by combining two or more of the first element, the second element, and the third element, as well as the first element, the second element, or the third element.

The term "display apparatus" used herein may include a display apparatus, such as a liquid crystal module (LCM), an organic light emitting display module (OLED Module), or the like, which includes a display panel and a driver for driving the display panel. The display apparatus may include a notebook computer, a television, a computer monitor, a vehicle apparatus, an automotive apparatus, an equipment apparatus including one or more components or parts for a vehicle, a set electronic apparatus (or a set device or a set apparatus) including a mobile electronic apparatus such as a smartphone, an electronic pad, etc., which are a complete product or final product including the LCM, the OLED module, or the like.

Accordingly, the display apparatus used herein may include a display apparatus itself, such as the LCM, the OLED module, etc., and an application product including the LCM, the OLED module, etc. or a set apparatus that is an apparatus for end consumers.

In some embodiments or examples, the LCM or the OLED module including the display panel, driver, and the like may be referred to as "display apparatus," and an electronic apparatus including the LCM or the OLED module as a complete product may be referred to as "set apparatus." For example, the display apparatus may include a display panel of a liquid crystal display (LCD) or an organic light emitting display (OLED), and a source PCB that is a controller for driving the display panel. The set apparatus may further include a set PCB that is a set controller for controlling the entire of the set apparatus, with being electrically connected to the source PCB.

All types of display panels, such as a liquid crystal display panel, an organic light emitting diode (OLED) display panel, an electroluminescent display panel, and the like, may be used as the display panel used herein. Embodiments of the present disclosure are not limited thereto. For example, the display panel may be a display panel capable of generating sound through vibration caused by a vibration generation device according to embodiments of the present disclosure. There is no limitation to a shape or a size of a display panel applied to a display apparatus according to embodiments of the present disclosure.

For example, a display panel that is a liquid crystal display panel may include a plurality of gate lines, a plurality of data lines, and a plurality of pixels formed in intersection areas of the gate lines and the data lines. Further, the display panel may include an array substrate including a thin film transistor which is a switching component for adjusting light transmittance in each pixel, an upper substrate including a color filter and/or a black matrix etc., and a liquid crystal layer formed between the array substrate and the upper substrate.

A display panel that is an OLED display panel may include a plurality of gate lines, a plurality of data lines, and a plurality of pixels formed in intersection areas of the gate lines and/or the data lines. Further, the display panel may include an array substrate including a thin film transistor which is a component for selectively applying a voltage to each pixel, an OLED layer over the array substrate, and an encapsulation substrate disposed to cover the OLED layer on the array substrate. The encapsulation substrate can protect the thin film transistor, the OLED layer, and the like from an external impact, and prevent moisture or oxygen from penetrating into the OLED layer. A layer formed over the array substrate may include an inorganic light emitting layer, such as a nano-sized material layer, and a quantum dot light emitting layer, or the like. As another example, a micro light emitting diode may be included.

The display panel may further include backing, such as a metal plate attached on the display panel. Another structure, for example, a different structure formed of a different material, may be included.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, embodiments of the present disclosure will be described in detail with reference to the accompanying drawings. In denoting elements of the drawings by reference numerals, the same elements will be referenced by the same reference numerals although the elements are illustrated in different drawings. Scale of the components shown in the accompanying drawings is illustrated for convenience of description and may be different from actual scale; thus, embodiments of the present disclosure are not limited to the scale shown in the drawings.

Figure 1B:
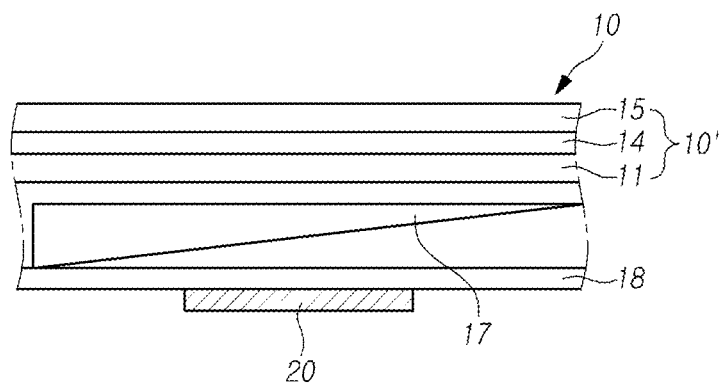

FIGS. 1A and 1B illustrate a display apparatus according to an embodiment of the present disclosure.

With reference to FIGS. 1A and 1B, a vibration generation device 20 may be applied to the display apparatus to provide haptic effects or sound generating effects. For example, a piezoelectric actuator using piezoelectric ceramic element or a voice coil motor (VCM) having a great vibration intensity may be used as the vibration generation device 20. Since the vibration generation device 20 using the voice coil motor or the piezoelectric ceramic element is large in size or thick and opaque, it may be suitable to be disposed on the rear surface of a display apparatus rather than the front surface thereof. Thus, the magnitude of the vibration acceleration felt by the user through a surface of the display apparatus may be reduced. For example, since the piezoelectric actuator may be a stacked actuator in which multiple layers are stacked, when the piezoelectric actuator is implemented in the display apparatus, the thickness of the display apparatus becomes greater and power consumption increases. When the piezoelectric actuator is configured to have a film, such an actuator may suffer from low sound pressure compared with the voice coil motor. When the vibration generation device is configured with a piezoelectric composite including a piezoelectric ceramic element, because the piezoelectric composite vibrates in a horizontal direction (left and right directions) with respect to a horizontal direction of the display apparatus, it may unable to sufficiently vibrate the display apparatus and there is also a problem in which the piezoelectric ceramic is easily broken.

Although the vibration generation device 20 using the voice coil motor or the piezoelectric actuator takes advantage of having great vibration intensity, since such a vibration generation device is an opaque mechanical device, this cause the performance of the display panel for displaying images to be deteriorated; as a result, it is necessary for such a vibration generation device to be placed on the rear surface of the display apparatus.

FIG. 1A illustrates a vibration generation device 20 applied to an organic light emitting display (OLED) apparatus 20.

With reference to FIG. 1A, the organic light emitting display apparatus may include an organic light emitting display panel 10 including a substrate 11 including a thin film transistor, an organic light emitting element 12 disposed over the substrate 11, an encapsulation layer 13, a touch part 14, and a front member 15. The organic light emitting display apparatus may further include a back plate 16 as a back support structure of the OLED display apparatus. The vibration generation device 20 used for providing haptic effects etc. to the organic light emitting display apparatus is an opaque mechanical device, and thus, it may be suitable to be disposed at the rear surface of the display apparatus, for example, the rear surface or the inner surface of the back plate 16. Therefore, since the vibration generation device 20 on the rear surface of the organic light emitting display apparatus has low vibration efficiency in order for the vibration from the vibration generation device 20 to be transmitted up to the front surface of the organic light emitting display panel 10, thus, it is necessary to generate strong vibrations for allowing a user to recognize haptic feedback. As a result, power consumption for driving the vibration generation device 20 increases in order for the display apparatus to generate large vibrations.

FIG. 1B illustrates a vibration generation device 20 applied to a liquid crystal display (LCD) apparatus.

With reference to FIG. 1B, the liquid crystal display apparatus may include a liquid crystal display panel 10' that includes a substrate 11 including a thin film transistor and a liquid crystal layer, a touch part 14 over the substrate 11, and a front member 15. In addition, a backlight 17 for providing backlight to the liquid crystal display panel, a cover bottom 18 as a structure for supporting the rear surface of the display apparatus, and the like may be further included on the rear surface of the liquid crystal display panel 10'. A vibration generation device 20 applied to the liquid crystal display apparatus is an opaque mechanical device, and as a result, may be suitable to be disposed on the rear surface of the display apparatus, for example, the rear surface or the inner surface of the cover bottom 18. Since the backlight is disposed between the vibration generation device 20 and the front surface of the display panel, the vibration generation device 20 has low vibration efficiency in order for the vibration from the vibration generation device 20 to be transmitted up to the front surface of the liquid crystal display panel 10'. Therefore, it is necessary to generate strong vibrations for allowing a user to recognize haptic feedback. As a result, power consumption for driving the vibration generation device 20 increases in order for the display apparatus to generate strong vibrations. The present inventors recognized that it was necessary to develop a vibration generation device capable of providing haptic effects (haptic vibration) or sound effects to a display apparatus.

Figure 2:
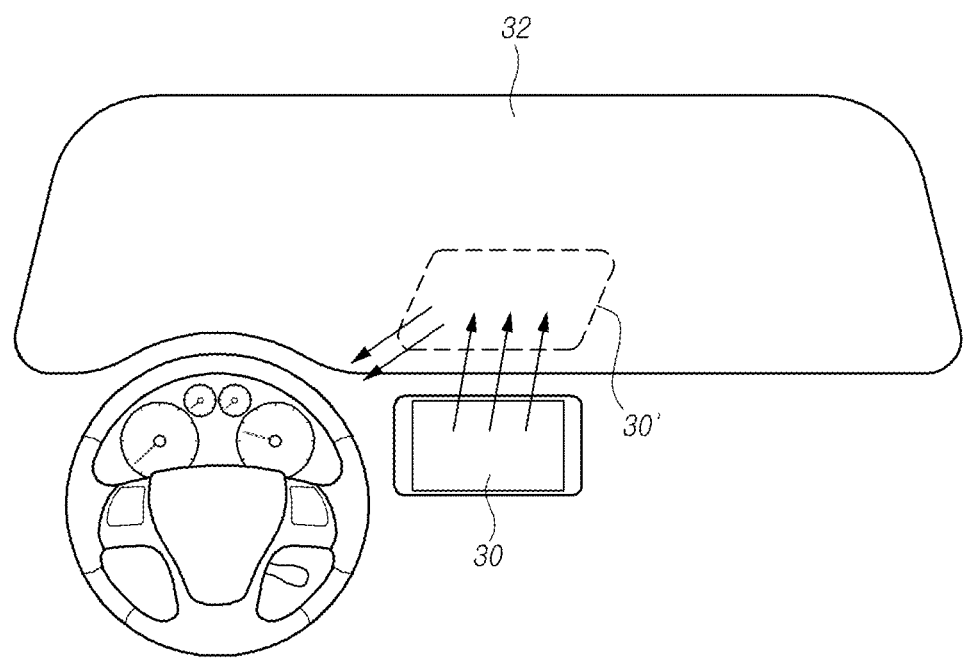
FIG. 2 is a view illustrating an example of a vehicle to which the display apparatus is applied in accordance with an embodiment of the present disclosure.

FIG. 2 illustrates a vehicle to which a display apparatus according to an embodiment of the present disclosure is applied.

FIG. 2 illustrates a phenomenon in which a reflected image is displayed on a windshield of a vehicle. A vehicle display 30 with a predetermined size, such as navigation for guiding the vehicle or a display apparatus to provide information to a user, may be disposed in the cluster or on the right side thereof, inside the vehicle. This vehicle display 30 may be a vehicle infotainment apparatus for providing various information to a driver of a vehicle, and vehicle display 30 with a predetermined size or more may be generally disposed in front of or in front side of the driver or passenger. When such a vehicle display 30 is employed, the light emitted from the display may be reflected from the inner surface of the windshield on the front surface of the vehicle, and there is a possibility that the reflected light may cause an obstacle in the front view of the vehicle. For example, a liquid crystal display apparatus or an organic light emitting display apparatus may be used as the vehicle display 30. Since such a display apparatus has a certain viewing angle equal to or more than a predetermined value, a part of the light emitted from the display apparatus may be reflected from the inner surface of the windshield 32 which is the front glass of the vehicle, and thus, a reflecting image 30' may be visually viewed. As a result, there is a possibility that the front sight of the vehicle may be obstructed by the reflected light from the windshield. Such a phenomenon may cause a serious problem to the driving of the vehicle in a situation where surrounding environment is dark, such as in the nighttime or in the tunnel. Therefore, there is necessary to cut off a certain amount of light traveling toward the vehicle windshield among light emitted from the vehicle display apparatus.

The present inventors recognized the above problems, and conducted various experiments to improve vibration performance/characteristics, sound quality/characteristics, and haptic effects. Through the experiments, the inventors recognized that it is necessary to employ a piezoelectric ceramic to produce required vibration characteristics and to be formed of organic materials to supplement the brittleness of the piezoelectric ceramic and to realize rigidity and flexibility of the piezoelectric ceramic. Thus, the inventors invented a vibration generation device capable of providing vibration characteristics/performance or haptic characteristics/effects with being disposed in the front surface or inner surface of a display apparatus, and capable of controlling a light path, a display apparatus including the vibration generation device, and a vehicle including the vibration generation device.

Hereinafter, for convenience of description, the vibration generation device is discussed as an equal device to a piezoelectric optical apparatus.

Hereinafter, discussions will be conducted on the vibration generation device, a display apparatus including the vibration generation device, and a vehicle including the vibration generation device, according to embodiments of the present disclosure, with reference with the accompanying drawings.

Figure 3:
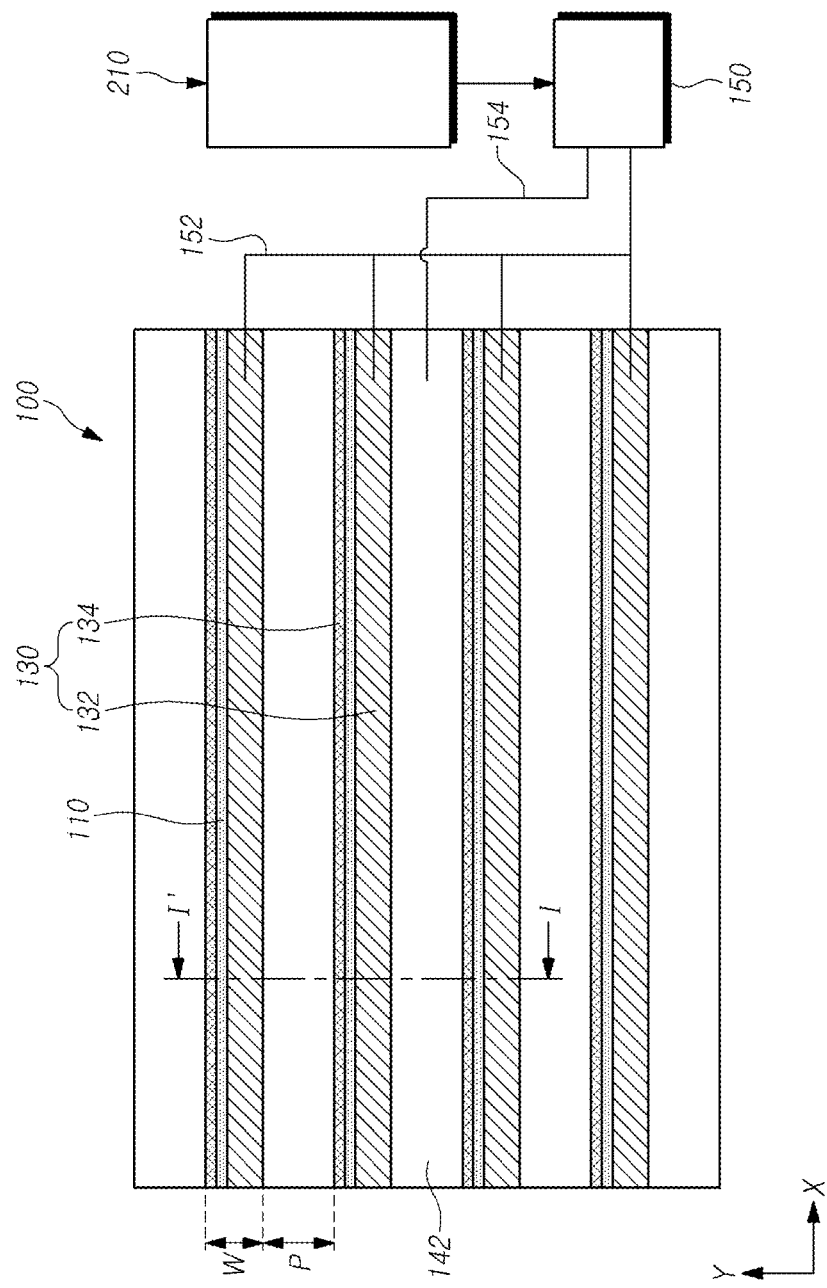
FIG. 3 is a plan view illustrating a vibration generation device in accordance with embodiments of the present disclosure.
Figure 4:
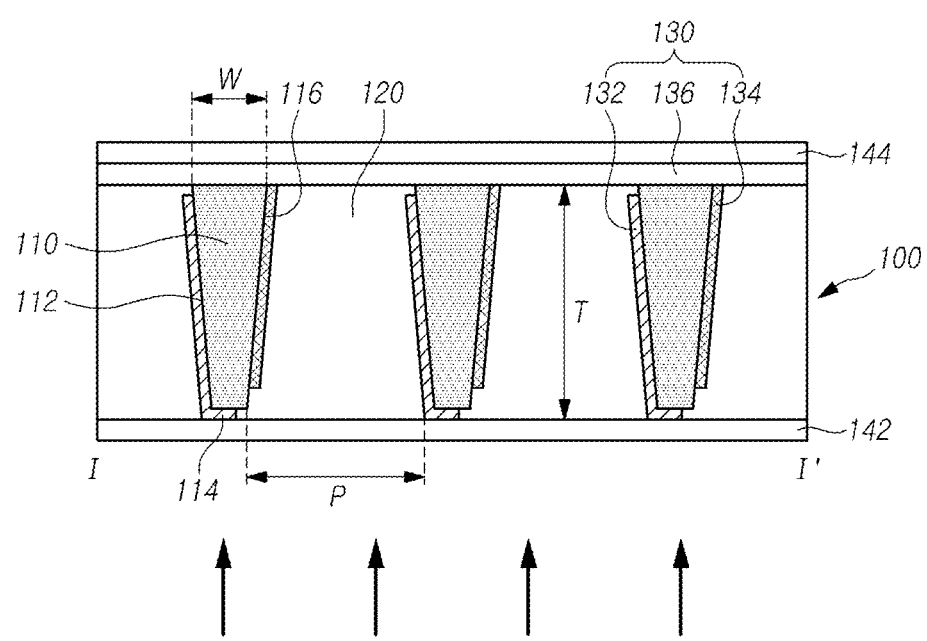
FIG. 4 is a cross-sectional view taken along line I-I' shown in FIG. 3.

FIG. 3 is a plan view illustrating the vibration generation device according to an embodiment of the present disclosure. FIG. 4 illustrates a cross-sectional view of the vibration generation device taken along line I-I' of FIG. 3.

With reference to FIGS. 3 and 4, the vibration generation device 100 may include one or more piezoelectric ceramic part(s) 110, a piezoelectric material layer 120 between the piezoelectric ceramic parts 110, and an electrode part 130 providing electric field for providing piezoelectric characteristics/effects to one or more of at least one of the piezoelectric ceramic parts 110 and the piezoelectric material layer 120.

For example, the vibration generation device 100 may include a plurality of piezoelectric ceramic parts 110 spaced apart from one another with a predetermined pitch P and extending in a first direction X with a first width W and a first thickness T, the electrode part 130 including a first electrode 132 on a first surface of each piezoelectric ceramic part and a second electrode 134 on a second surface of each piezoelectric ceramic part, and the piezoelectric material layer 120 between the plurality of piezoelectric ceramic parts. The piezoelectric ceramic parts 110 may be a first portion, and the piezoelectric material layer 120 may be a second portion. For example, the piezoelectric material layer 120 may be formed of a transparent piezoelectric material layer to realize transparency.

Each piezoelectric ceramic part 110 may have the first width W and be in the form of a stripe extending in a first direction (X-axis direction) of the vibration generation device 100. The plurality of piezoelectric ceramic parts 110 may be arranged spaced apart from one another with a predetermined interval, for example, pitch P.

The first direction (X-axis direction) may be a long axis direction of the display apparatus, but embodiments of the present disclosure are not limited thereto. For example, the first direction (X-axis direction) may be a direction perpendicular to the direction from the center of the display apparatus toward the reflector producing the reflected light effect according to FIG. 2. For example, when a display apparatus using the vibration generation device according to embodiments of the present disclosure is disposed in the vehicle shown in FIG. 2, the vertical direction from the display apparatus toward the vehicle windshield may be the Y-axis direction; the horizontal direction perpendicular thereto may be the X axis direction; and the first direction which is the extending direction of the piezoelectric ceramic parts 110 may be the X axis direction.

As described in detail below with respect to FIG. 5, the piezoelectric ceramic parts 110 used in the vibration generation device according to embodiments of the present disclosure may not only provide a strong piezoelectric effect (e.g., vibration) but also block or cut-off an optical path through an opaque portion. Therefore, as the piezoelectric ceramic parts 110 extends in the first direction, the piezoelectric ceramic parts 110 may selectively block light traveling from the display apparatus to a reflector; therefore, it is possible to have a desired light path control function.

The piezoelectric ceramic parts 110 according to embodiments of the present disclosure may be formed of a material having opaque optical characteristics not allowing light to be transmitted and comparatively strong piezoelectric characteristics. For example, the piezoelectric ceramic parts 110 may be formed of a material such as a polycrystalline PZT-based ceramic material, a polycrystalline PT-based ceramic material, a PZT-complex perovskite material, $BaTiO_3$, or the like; however, embodiments of the present disclosure are not limited thereto. For example, the piezoelectric ceramic parts 110 may be formed of a piezoelectric material or a piezoelectric ceramic fiber material having opaque optical characteristics not allowing light to be transmitted and comparatively strong piezoelectric characteristics.

The piezoelectric ceramic parts 110 according to embodiments of the present disclosure may be configured in the form of a film having a predetermined thickness, and the piezoelectric material layer 120 may be between the plurality of piezoelectric ceramic parts, for example, all of at least a part of the rest space of the vibration generation device 100 except for the piezoelectric ceramic parts 110. For example, when the vibration generation device 100 is formed in the form of the film, since the vibration generation device 100 may have a smaller thickness than a display panel, it is possible to prevent the thickness of the display panel from being increase due to the vibration generation device 100. The vibration generation device 100 may use the display panel as a vibration plate. For example, the vibration generation device 100 may be represented by a sound generating module, a sound generating device/apparatus, a film actuator, a film-type piezoelectric composite actuator, a film speaker, a film piezoelectric speaker, or a film piezoelectric composite speaker, and the like; however, embodiments of the present disclosure are not limited thereto.

The piezoelectric material layer 120 may be formed of a transparent piezoelectric material with a light transmittance of a certain level or more. For example, the transparent piezoelectric material layer 120 may be formed of at least one or more material of polyvinylidene fluoride (PVDF), polyvinylidene fluoride-co-trifluoroethylene (P(VDF-TrFE)), relaxor ferroelectric polymer, PVDF polymer doped with P(VDF-TrFe-CFE), P(VDF-TrFE-CTFE), CNT and the like, and poly bis (trifluoroethoxy) phosphazene; however, embodiments of the present disclosure are not limited thereto. For example, other polymer materials for the piezoelectric material layer 120 may be used as long as they have piezoelectricity and a light transmittance of a certain level or more. The piezoelectric characteristic of the piezoelectric material layer 120 may be lower than the piezoelectric characteristic of the piezoelectric ceramic parts 110.

The vibration generation device 100 according to embodiments of the present disclosure may include the electrode part 130 for providing electric field that may cause the piezoelectric effect to be produced to the piezoelectric ceramic parts 110 and the transparent piezoelectric material layer 120. The electrode part 130 may include the first electrode 132 on a first surface of at least one of the piezoelectric ceramic parts 110 and the second electrode 134 on a second surface of at least one of the piezoelectric ceramic parts 110. The vibration generation device 100 may further include a third electrode 136 electrically connected to the second electrode 134 and disposed on the entire surface of one side (or the entire of at least one side surface) of the piezoelectric ceramic parts 110 and the piezoelectric material layer 120. The third electrode 136 may be a transparent electrode.

With reference to FIG. 4, the first electrode 132 may be disposed on a first side surface 112 and an upper surface 114 of at least one of the piezoelectric ceramic parts 110. The second electrode 134 may be disposed on a second side surface 116 of at least one of the piezoelectric ceramic parts 110. The first electrode 132 may be disposed in a different manner from the second electrode 134. For example, the first electrode 132 may be disposed only on the first side surface 112 of at least one of the piezoelectric ceramic parts 110. The second electrode 134 may be disposed only on the second side surface 116 of at least one of the piezoelectric ceramic parts 110, or the second electrode 134 may be disposed on both the second side surface 116 and the upper surface 114 of at least one of the piezoelectric ceramic parts 110.

The first electrode 132 and the second electrode 134 constituting the electrode part 130 may be formed of an opaque metal electrode material. For example, the first electrode 132 and the second electrode 134 may be formed of a metal material such as copper (Cu), aluminum (Al), nickel (Ni), chromium (Cr), nickel-phosphorus (Ni—P), tungsten (W), platinum (Pt) and silver (Ag), or an alloy material thereof. The third electrode 136 constituting the electrode part 130 may be electrically connected to the second electrode 134 and disposed on entire surface of one side (or the entire of at least one side surface) of at least one of the piezoelectric ceramic parts 110 and the transparent piezoelectric material layer 120. The third electrode 136 may be formed of a transparent conductive material such as ITO (Indium Tin Oxide), IZO (Indium Zinc Oxide), or the like.

With reference to FIG. 3, a driver 150 of the vibration generation device 100 may apply power or voltages causing the piezoelectric effect to be produced to at least one of the piezoelectric ceramic parts 110 and the transparent piezoelectric material layer 120 through a plurality of first connection lines 152 connected to a plurality of first electrodes 132 spaced apart from one another and a second connection line 154 connected to the third electrode 136 on the front surface of the vibration generation device 100. When the third electrode 136 is used, the number of lines connecting between the driver 150 and the electrode part 130 may be reduced.

The vibration generation device 100 according to embodiments of the present disclosure may provide vibration to the display panel depending on a touch input of a user input to the display apparatus. The driver 150 may receive a touch input sensing signal obtained by sensing the display panel from a touch driver 150 employed in the display apparatus to which the vibration generation device 100 is disposed, and thereby, may apply power to the electrode part 130 of the vibration generation device 100 to cause the vibration generation device 100 to produce vibrate above a certain level. The driver 150 may be included in the touch driver 210 in the display apparatus or may be separately provided from the touch driver.

The vibration generation device 100 according to embodiments of the present disclosure is required to produce piezoelectric effects and have a light control function for blocking or controlling a path of light emitted from the display apparatus, in addition to the piezoelectric effects. In order for the vibration generation device 100 to have vibration characteristics and light control characteristics while maintaining transparent characteristics, the piezoelectric ceramic parts 110 may be configured to have a pitch P, a first width W, and a first thickness T.

As illustrated in FIG. 3, the pitch P of the piezoelectric ceramic parts 110 may be a spaced distance or interval between the piezoelectric ceramic parts 110, or a separation distance between the piezoelectric ceramic parts 110 extending in the second direction (Y-axis direction) perpendicular to the first direction. The first width W of the piezoelectric ceramic parts 110 may be a width of each piezoelectric ceramic part in a plan view, or a width of each piezoelectric ceramic part 100 extending in the second direction perpendicular to the first direction. The first thickness T of the piezoelectric ceramic parts 110 may be a height or depth of the piezoelectric ceramic parts in the thickness direction (i.e., a direction perpendicular to both X-axis and Y-axis directions) of the vibration generation device according to embodiments of the present disclosure. In this case, the pitch P of the piezoelectric ceramic parts may be greater than the first width W of the piezoelectric ceramic parts, and the first thickness T of the piezoelectric ceramic parts may be greater than the pitch P in order to maintain the vibration characteristics and the light control characteristics while maintaining a minimum transparent characteristic.

Hereinafter, the pitch P, the first width W and the first thickness T of the piezoelectric ceramic parts 110 will be discussed.

For example, in order to prevent each piezoelectric ceramic part 110 extending in the first direction from being visible to the user in a stripe shape, the first width W of the piezoelectric ceramic parts may be 30 μm or less, about 20 μm or less, or about 10 μm. The pitch P of the piezoelectric ceramic parts 110 may be not less than two times and not more than five times of the first width W, for example, about 30 μm. If the pitch P of the piezoelectric ceramic parts 110 is equal to or less than two times of the first width W, an arrangement interval between the piezoelectric ceramic parts is too small, and thus, the transparency of the vibration generation device may be deteriorated. Further, if the pitch P of the piezoelectric ceramic parts 110 is equal to or more than five times of the first width W, the light control function for blocking the light in the required second direction may not be satisfied.

The first thickness T of the piezoelectric ceramic parts 110 may be not less than two times and not more than four times of the pitch P, for example, about 100 μm. If the first thickness T of the piezoelectric ceramic parts 110 is equal to or less than twice the pitch P, the required light blocking effect in the second direction may not be sufficiently secured due to the overall thickness reduction of the vibration generation device. If the first thickness T of the piezoelectric ceramic parts 110 is equal to or more than four times of the pitch P, not only the overall transmittance may lower but also the viewing angle of the display apparatus may reduce as light from the display apparatus too travels toward the front.

Accordingly, by adjusting the first width W of the piezoelectric ceramic parts to be 30 μm or less, for example, 20 μm or less; the pitch P to be not less than two times and not more than five times of the first width W; and the first thickness T to be not less than two times and not more than four times of the pitch P, it is possible for a desired light control characteristic to be secured while maintaining a minimum transparent characteristic of the vibration generation device.

The vibration generation device according to embodiments of the present disclosure may further include protective layers 142 and 144 for covering at least one of the upper surface and the lower surface of at least one of the piezoelectric ceramic parts 110 and the transparent piezoelectric material layer 120. The protective layers 142 and 144 may be cover and protect the electrode part 130 of the vibration generation device and improve the insulation between the electrodes.

FIG. 3 is a plan view viewed from a lower portion of FIG. 4 that is a sectional view, for example, in a direction to which light is incident. The plurality of piezoelectric ceramic parts 110 extending in the first direction and spaced apart from one another by a predetermined pitch P, and the electrode part 130 are disposed, and the protective layer 142 is disposed on the entire surface of one side (or the entire of at least one side surface) of the piezoelectric ceramic parts 110 and the electrode part 130.

According to the embodiments of the present disclosure, since the first electrode 132 and the second electrode 134 of the electrode part are disposed to surround at least one of the piezoelectric ceramic parts 110, it is possible to improve not only the light shielding/blocking effects but also the piezoelectric characteristics by increasing the strength of the electric field applied to the piezoelectric ceramic parts 110 and the piezoelectric material layer 120. Since the third electrode 136 disposed on the entire surface of one side (or the entire of at least one side surface) of the vibration generation device acts as a transparent electrode, this presents an advantage of easily applying voltages to the second electrode 134.

When disposed in the vicinity or periphery of a display panel of a liquid crystal display apparatus or an organic light emitting display apparatus, etc., the vibration generation device 100 according to embodiments of FIGS. 3 and 4 may allow light from the display apparatus to transmit such that the light may travel toward a predetermined path, and provide haptic vibration through piezoelectric effects of piezoelectric ceramic parts and the piezoelectric material layer caused by a difference in voltages applied to the electrode part.

Figure 5:
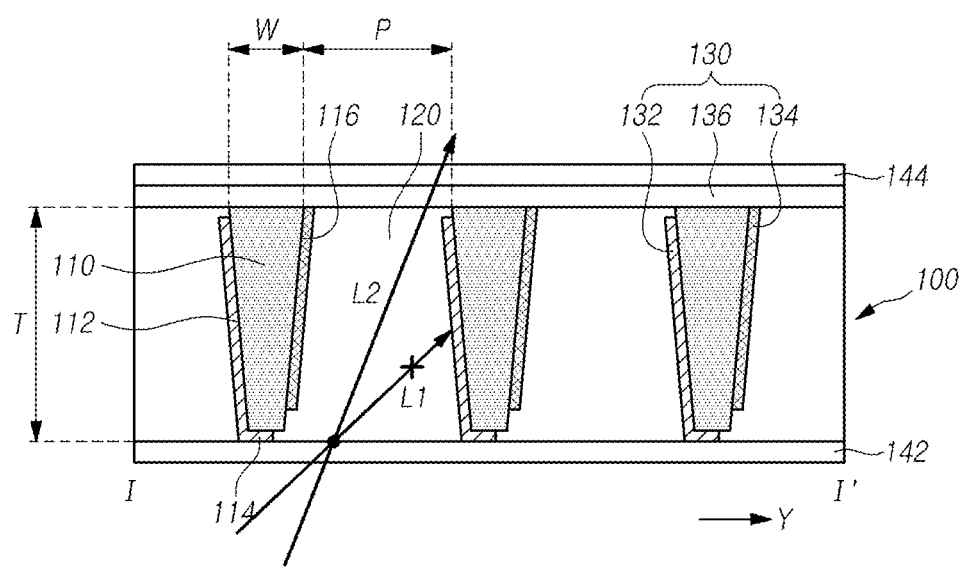
FIG. 5 is a view illustrating an optical path control function of the vibration generation device in accordance with an embodiment of the present disclosure.

FIG. 5 illustrates a light path control function of the vibration generation device according to an embodiment of the present disclosure.

The vibration generation device 100 according to embodiments of the present disclosure includes the piezoelectric ceramic parts 110, and the first and second electrodes 132 and 134 on the piezoelectric ceramic parts 110. The first and second electrodes 132 and 134 may be formed of opaque materials or block or shield light.

With reference to FIG. 5, light L1 traveling in the second direction (Y-axis direction) in which the light reflector causing the reflection problem is disposed among light emitted from the display apparatus may be blocked by the piezoelectric ceramic parts 110 or the like, and only light L2 within a predetermined range of viewing angle in the second direction (Y-axis direction) may be transmitted. Therefore, since the light of the display apparatus does not reach the light reflector by the light control function of the vibration generation device 100, it is possible to solve a problem in which the light of the display apparatus is reflected by a light reflector, such as a vehicle windshield or the like.

Figure 6:
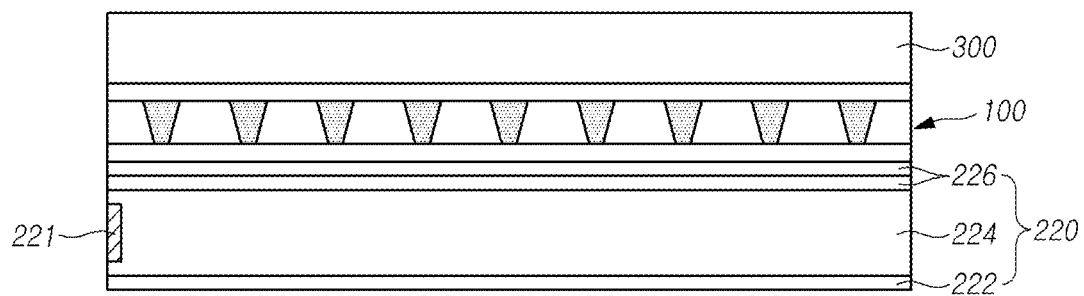
FIG. 6 is a view illustrating a display apparatus including a vibration generation device in accordance with an embodiment of the present disclosure.

FIG. 6 illustrates a display apparatus including the vibration generation device according to an embodiment of the present disclosure.

With reference to FIG. 6, a liquid crystal display apparatus may include a liquid crystal display panel 300 including a thin film transistor substrate, a backlight 220 for providing backlight to the liquid crystal display panel 300, and the vibration generation device 100 according to the embodiments of FIGS. 3 and 4. The vibration generation device 100 may be disposed in at least one or more of: between the backlight 220 and the liquid crystal display panel 300, on an upper surface of the liquid crystal display panel 300, and on a lower surface of the liquid crystal display panel 300.

The liquid crystal display panel 300 may include an array substrate including the thin film transistor, an upper substrate including a color filter and/or a black matrix etc., and a liquid crystal material layer between the array substrate and the upper substrate. The liquid crystal display panel 300 may be a display panel in which the alignment state of the liquid crystal material layer may be adjusted according to electric field applied between both electrodes in a pixel area, and thereby, images may be displayed depending on the light transmittance adjusted according to the alignment state of the liquid crystal material layer. This liquid crystal display panel 300 may include an active area AA for providing images to a user and a non-active area NA that is a peripheral area of the display area AA. The liquid crystal display panel 300 may be manufactured by attaching or combining a first substrate as the array substrate on which the thin film transistor (TFT) or the like is formed and at least one pixel area is defined, and a second substrate as the upper substrate on which a black matrix and/or a color filter layer etc. are formed.

The array substrate or the first substrate on which at least one thin film transistor is formed may further include a plurality of gate lines GL extending in the first direction, and a plurality of data lines DL extending in the second direction perpendicular to the first direction, and one pixel area P may be defined by each gate line and each data line. At least one thin film transistor may be formed in one pixel area P, and the gate electrode or source electrode of each thin film transistor may be connected to the gate line and the data line, respectively.

The backlight 220 may include a light source 221, a light guide plate 224 for expanding the light from the light source to the front surface of the display panel, and a reflection plate 222 for reflecting the light toward the liquid crystal display panel 300. One or more optical sheets 226 may be further disposed on an upper portion of the light guide plate 224, and the optical sheet may include a light diffusion sheet for diffusing light, an optical prism sheet for condensing light, and the like.

Figure 7:
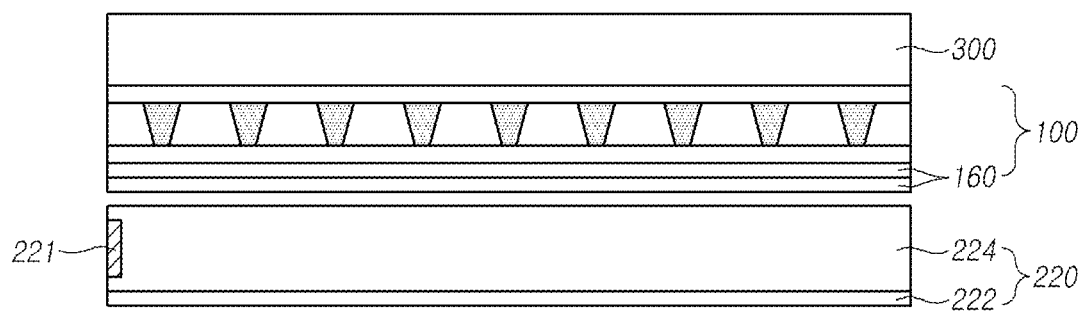
FIG. 7 is a view illustrating a display apparatus including a vibration generation device in accordance with another embodiment of the present disclosure.

FIG. 7 illustrates a display apparatus including a vibration generation device according to another embodiment of the present disclosure.

With reference to FIG. 7, a liquid crystal display apparatus may include a liquid crystal display panel 300 including a thin film transistor substrate, a backlight 220 for providing backlight to the liquid crystal display panel 300, and the vibration generation device 100 according to the embodiments of FIGS. 3 and 4. The vibration generation device 100 may be disposed in at least one or more of: between the backlight 220 and the liquid crystal display panel 300, on an upper surface of the liquid crystal display panel 300, and on a lower surface of the liquid crystal display panel 300.

The vibration generation device 100 may further include one or more optical prism sheets 160 which condense light to enhance light transmission efficiency and which are disposed on the entire of one surface to which light is incident, for example, between the backlight 220 and the liquid crystal display panel 300. The optical prism sheets 160 may include various functional sheets such as a reflection type polarizing film for brightness enhancement. The reflection type polarizing film is an optical film which transmits only light that vibrates in one direction among incident natural light while vibrating in various directions, and which reflects light that vibrates in other directions. The reflection type polarizing film may include a brightness enhancement film called the dual brightness enhancement film (DBEF).

The liquid crystal display panel 300 of FIG. 7 may have the same configuration as that described in FIG. 6. The backlight 220 of the embodiment of FIG. 7 may also include a light source 221, a light guide plate 224 that expands light from the light source to the front of the liquid crystal display panel 300, a reflector 222 for reflecting the light toward the liquid crystal display panel 300, and the like. Although not shown, the backlight 220 of the embodiment of FIG. 7 may further include an optical sheet such as an additional diffusion plate or the like in addition to an optical prism sheet 160 in the vibration generation device 100.

The term "display apparatus" used herein may include not only a display apparatus such as a liquid crystal module (LCM) or an organic light emitting module including a display panel and a driver for driving the display panel, but a set electronic apparatus or a set apparatus such as a notebook computer, a television, a computer monitor, a mobile electronic device such as a smart phone or an electronic pad, or the like, which is a finished product including such a LCM or organic light emitting module. For example, the display apparatus herein may include not only a display apparatus in a narrow range such as the LCM, but also a set apparatus which is an application product including the display apparatus.

As another embodiment, there may be provided an organic light emitting display apparatus including: an organic light emitting display panel including a thin film transistor substrate, and the vibration generation device according to the embodiments of the present disclosure, which is disposed on the front surface of the organic light emitting display panel. The organic light emitting (OLED) display panel may be a single assembled display panel formed by combining or integrating, into one panel, a plurality of layers, such as a light emitting panel layer as a glass substrate including an organic light emitting element, a thin film transistor (TFT), and the like, and an encapsulation layer, and the like.

Since the liquid crystal display apparatus and the organic light emitting display apparatus may further include a touch driver (210 of FIG. 3) for detecting a touch input from a user, and a driver 150 for controlling the driving of the vibration generation device 100. The driver 150 can receive a touch input sensing signal obtained by sensing the liquid crystal display panel or the organic light emitting display panel from the touch driver 210 of display apparatus, and thereafter, apply power to the electrode part 130 of the vibration generation device 100 when the touch input sensing signal is received.

Figure 8:
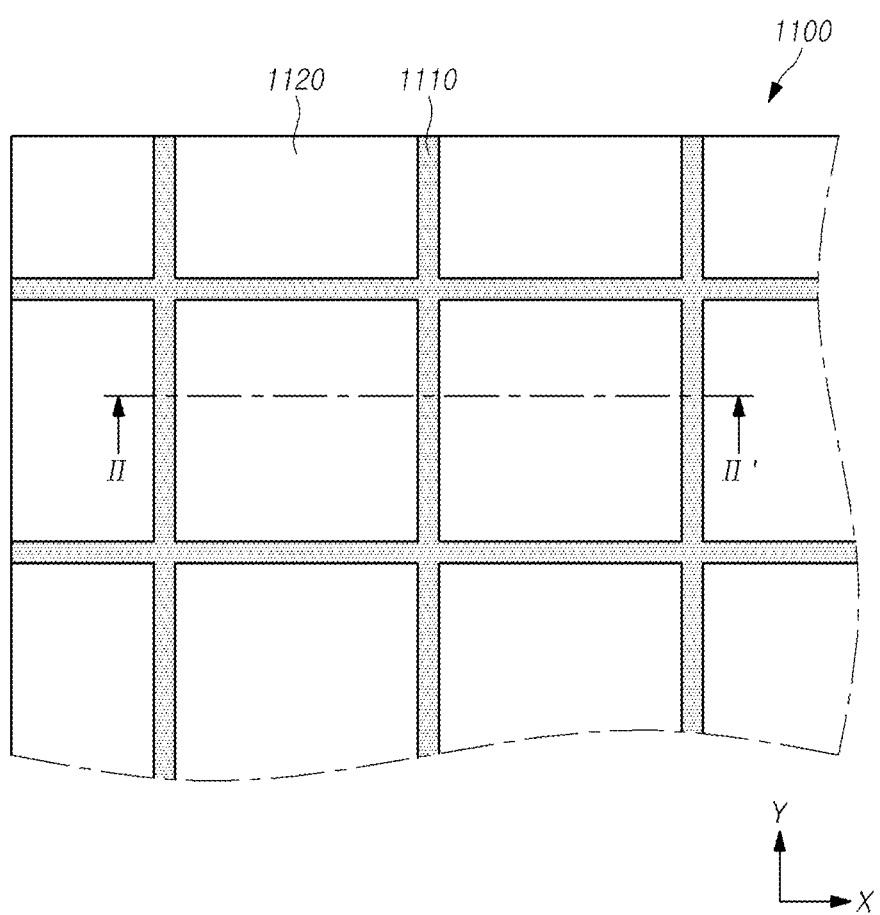
FIG. 8 is a view illustrating a vibration generation device in accordance with another embodiment of the present disclosure.
Figure 9:
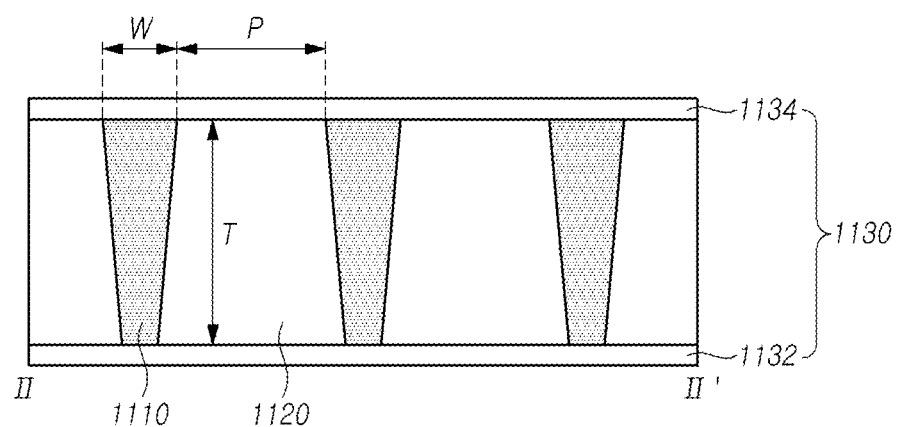
FIG. 9 is a cross-sectional view taken along line II-II' shown in FIG. 8.

FIG. 8 illustrates a vibration generation device according to another embodiment of the present disclosure. FIG. 9 illustrates a cross-sectional view of the vibration generation device taken along line II-II' of FIG. 8.

With reference to FIGS. 8 and 9, the vibration generation device 1100 may include a piezoelectric ceramic part 1110 including a plurality of piezoelectric ceramic lattices having a predetermined first width W, a piezoelectric material layer 1120 in at least one of the piezoelectric ceramic lattices of the piezoelectric ceramic part 1110, and an electrode part 1130 including a first electrode 1132 and a second electrode 1134 on an upper surface and a lower surface of the piezoelectric ceramic part 1110 and the piezoelectric material layer 1120, respectively. The first electrode 1132 and the second electrode 1134 may be transparent electrodes.

When compared with the embodiment of FIG. 3, the piezoelectric ceramic part 1110 of the vibration generation device 1100 illustrated in FIGS. 8 and 9 is not in the form of a stripe extending in the first direction, but is in a lattice or matrix pattern on the front surface of the vibration generation device. Further, the two electrodes of the electrode part 1130 are not disposed on the surface of the piezoelectric ceramic part, but are disposed on both opposite sides of the vibration generation device, respectively.

Descriptions with reference to the embodiment of FIG. 3 may be applied substantially equally or similarly to a material, a pitch P, a first width W and a first thickness T of the piezoelectric ceramic part 1110 and a material of the piezoelectric material layer 1120, of the vibration generation device 1100 of FIGS. 8 and 9, and thus, may be omitted.

In addition, the vibration generation device 1100 of FIGS. 8 and 9 may be applied to a liquid crystal display apparatus or an organic light emitting display apparatus, and applying an optical prism sheet to the vibration generation device 1100 of FIGS. 8 and 9 is substantially similar to the description given above with reference to FIG. 3, and thus, may be omitted.

In the vibration generation device 1100 of FIGS. 8 and 9, since the piezoelectric ceramic part 1110 is disposed in the lattice pattern, the light may be blocked in both the first direction and the second direction, thereby resulting in light shielding characteristics being improved. For example, since light may be transmitted only at a predetermined viewing angle in front of the display apparatus, the phenomenon in which reflected images are displayed as illustrated in FIG. 2 may be further suppressed. Further, when a voltage is supplied to produce piezoelectric vibration effects, the voltage is required to be provided to only the first electrode 1132 and the second electrode 1134 which are formed on both surfaces of the vibration generation device 1100; therefore, a structure of connection lines between a driver and the electrode may be simplified.

Figure 10:
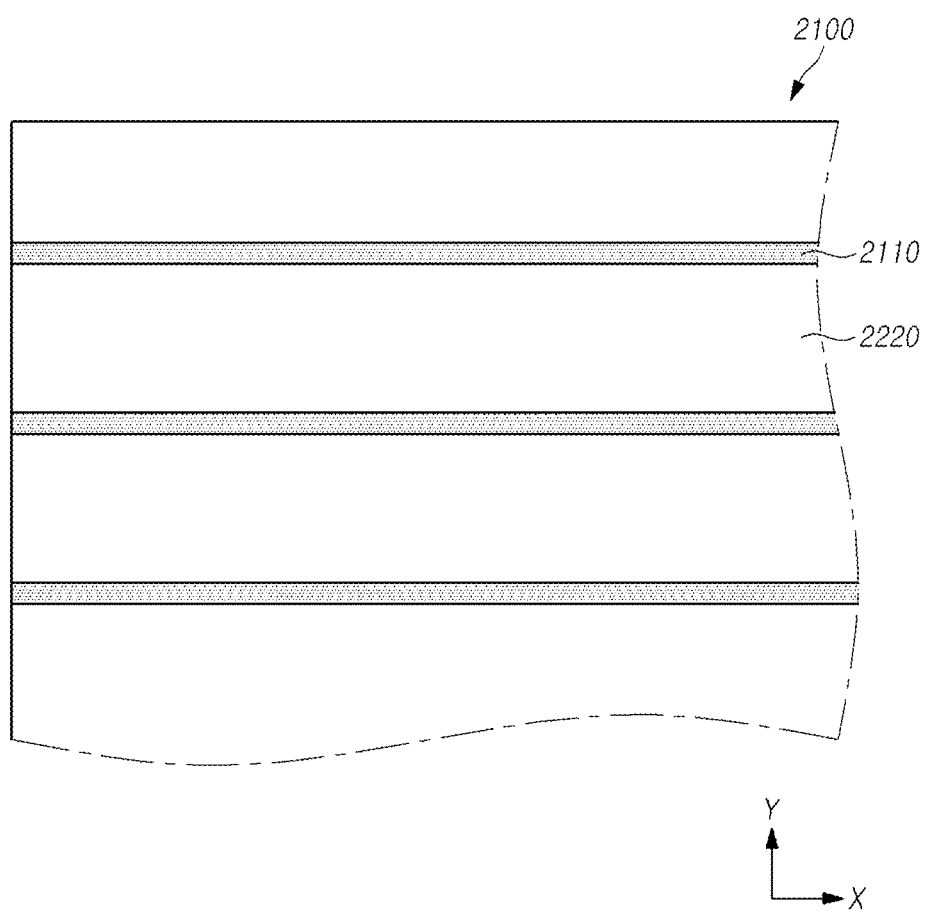
FIG. 10 is a view illustrating a vibration generation device in accordance with another embodiment of the present disclosure.

FIG. 10 illustrates a vibration generation device according to another embodiment of the present disclosure.

With reference to FIG. 10, a vibration generation device 2100 according to an embodiment of present disclosure may include a plurality of piezoelectric ceramic parts 2110 spaced apart from one another with a pitch P and extending in the first direction with a first width W and a first thickness T, a piezoelectric material layer 2120 between the plurality of piezoelectric ceramic parts 2110, and an electrode part including a first electrode and a second electrode disposed on an upper surface and a lower surface of the piezoelectric ceramic parts 2110 and the piezoelectric material layer 2220, respectively. The first electrode and the second electrode may be transparent electrodes.

The vibration generation device 2100 of FIG. 10 may be a combination of the configuration of the piezoelectric ceramic part and the piezoelectric material layer of the vibration generation device of FIG. 3 and the configuration of the electrode part of FIGS. 8 and 9.

A description of a material, a pitch P, a first width W and a first thickness T of the piezoelectric ceramic part 2110 and a material of the piezoelectric material layer 2220, of the vibration generation device 2100 of FIG. 10 is substantially similar to the description given above with reference to FIG. 3, and thus, may be omitted.

In addition, the vibration generation device 2100 of FIG. 10 is applied to a liquid crystal display apparatus or an organic light emitting display apparatus, and applying an optical prism sheet to the vibration generation device 1100 of FIG. 10 is substantially similar to the description given above with reference to FIG. 3, and thus, may be omitted.

Since the vibration generation device 2100 of FIG. 10 can produce light blocking effects in the first direction, it has an advantage of higher light transmittance compared with the vibration generation device according to the embodiments of FIGS. 8 and 9, and a further advantage of simplifying the structure of the process of forming the electrode part and the structure of the connection lines between a driver and the electrode.

Figure 11A:
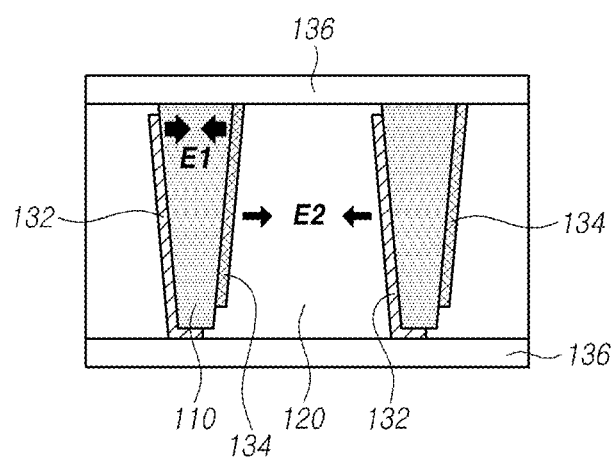
FIGS. 11A and 11B are views illustrating a piezoelectric effect of a vibration generation device in accordance with an embodiment of the present disclosure.
Figure 11B:
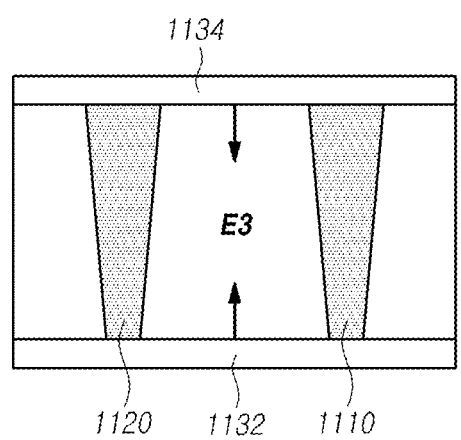

FIGS. 11A and 11B illustrate a piezoelectric effect of a vibration generation device according to an embodiment of the present disclosure.

FIG. 11A illustrates a strength of electric fields E1 and E2 formed between both electrodes of the vibration generation device of FIG. 3, and piezoelectric performance according to the strength of the electric field. FIG. 11B illustrates a strength of electric field E3 formed between both electrodes of the vibration generation device of FIG. 8 or FIG. 10, and piezoelectric performance according to the strength of the electric field.

With reference to FIG. 11A, in the vibration generation device of FIG. 3, a first electric field E1 may be formed between the first electrode 132 disposed the first surface of the piezoelectric ceramic part 110 and the second electrode 134 disposed the second surface thereof, and the piezoelectric ceramic part 110 may be mechanically deformed by the first electric field E1. Since a distance between the first electrode 132 and the second electrode 134 of vibration generation device of FIG. 3 is small by the first width W of the piezoelectric ceramic part 110, there may a possibility that a strong first electric field E1 may be formed between the both electrodes even when an equal potential difference is given.

With reference to FIG. 11B, in the vibration generation device of FIG. 8 or FIG. 10, since the electrode part includes the first electrode 1132 and the second electrode 1134 which are disposed on the entire surfaces of both surfaces of the vibration generation device, respectively, a third electric field E3 can be formed, by an applied voltage, between the first electrode 1132 and the second electrode 1134, and the piezoelectric ceramic part (1110 or 2110) and the piezoelectric material layer (1120 or 2220) may vibrate by the third electric field E3.

Further, as shown in Table 1 below, it may be seen that a piezoelectric characteristic of the material of the piezoelectric ceramic part 110 is superior to a piezoelectric characteristic of the material of the piezoelectric material layer 120. Accordingly, in the case of the vibration generation device of FIG. 3, even when an equal potential difference is supplied between both electrodes, it is possible to exhibit stronger piezoelectric characteristics compared with the vibration generation device of FIGS. 8 and 10. Accordingly, the vibration generation device of FIG. 3 may implement stronger vibration characteristics with the same power, or reduce power consumption required for a specific vibration effect.

In Table 1 below, (1) represents a VCM piezoelectric actuator; (2) represents a piezoelectric ceramic material; (3) represents a piezoelectric ceramic and piezoelectric material layer according to the embodiments of the present disclosure; and (4) represents a transparent piezoelectric polymer material.

TABLE 1

| Characteristic | (1) | (2) | (3) | (4) |
|---|---|---|---|---|
| Thickness | 5 mm or more | 500 μm~1 mm | 300 μm or less | 200 μm or less |
| Transmittance | 0% | 0% | 75% | 90% |
| Vibration acceleration | 10 G or more | 7 G or more | ~3 G | ~1 G |
| Driving voltage | 5-10 V | 30 V or less | 50~100 V | 400 V or more |
| Flexibility | No | No | Yes | Yes |

As shown in Table 1, it may be seen that the piezoelectric ceramic and piezoelectric material layer (3) formed by including the piezoelectric ceramic part and the piezoelectric material layer between the piezoelectric ceramic parts or between piezoelectric ceramic lattices of the piezoelectric ceramic part, which form the vibration generation device according to embodiments of the present disclosure, has piezoelectric characteristics (~3 G), higher transmittance (>75%), and flexibility, at a thin thickness (<300 μm), compared with each of the VCM actuator (1), the piezoelectric ceramic (2), or transparent piezoelectric polymer material (4).

Accordingly, even when disposed in the vicinity or periphery of a display panel of a liquid crystal display apparatus or an organic light emitting display apparatus, etc., the vibration generation device according to embodiments of the present disclosure may allow light from the display apparatus to transmit such that the light can travel toward a predetermined path, and provide haptic vibration through piezoelectric effects of piezoelectric ceramic parts and the piezoelectric material layer caused by a difference in voltages applied to the electrode part. For example, by allowing the vibration generation device herein to have a structure including the piezoelectric ceramic part and the piezoelectric material layer between the piezoelectric ceramic parts or between piezoelectric ceramic lattices of the piezoelectric ceramic part, and to have, for example the arrangement of the electrode part of FIG. 3, a size or arrangement of the piezoelectric ceramic part, or the like. It is possible to optimize light control characteristics, as well as to provide vibration to the display panel.

Figure 12:
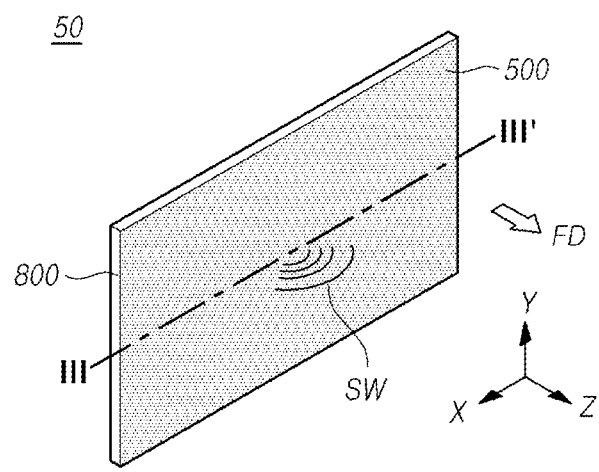
FIG. 12 is a view illustrating a display apparatus in accordance with an embodiment of the present disclosure.

FIG. 12 illustrates a vibration generation device according to another embodiment of the present disclosure.

With reference to FIG. 12, a display apparatus 50 in accordance with an embodiment of the present disclosure may include a display module 500, and a supporting member 800. Herein, the supporting member may be a structure, mechanism, unit/element, or configuration that supports the display apparatus, the display panel, or any component, module, or element in the display apparatus or the display panel. The display apparatus 50 may output sound SW (or display vibration sound) according to vibration of a display module 500 for displaying images. Accordingly, the display apparatus 50 according to embodiments of the present disclosure may provide sound SW toward the front FD of a display screen of the display module 500 by providing sound using the display module 500 as a vibrating plate for generating sound, and thereby, provide improved sound quality or improved immersion experience of a user or viewer.

Figure 13:
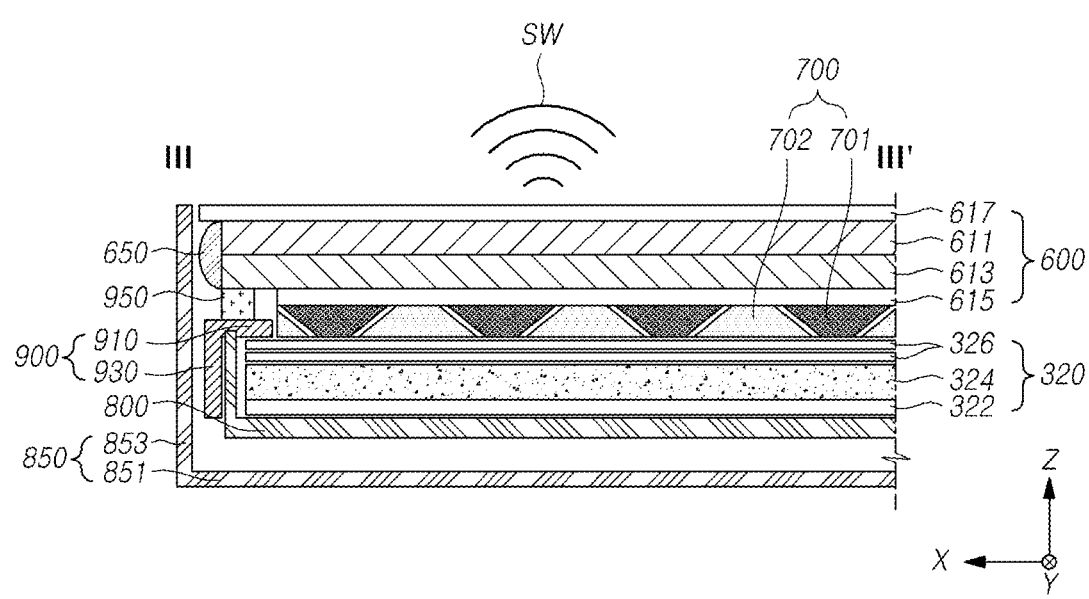
FIG. 13 is a cross-sectional view taken along shown in FIG. 12.

FIG. 13 is a cross-sectional view taken along III-III' shown in FIG. 12.

With reference to FIG. 13, a display apparatus 50 according to an embodiment of the present disclosure may include a display panel 600, a vibration generation device 700, a supporting member 800, and a panel guide 900.

The display panel 600 is a device configured to display images, for example, electronic images or digital images, and may be implemented by any type of panel including a liquid crystal display panel, an organic light emitting diode (OLED) display panel, an electroluminescent display panel, and the like. The display panel 600 may display images using light emitted from a backlight 320. The display panel 600 may output sound SW to a forward region FD of the display panel 600 or provide haptic vibration to display panel 600, using a vibration according to vibration of the vibration generation device 700. The vibration generation device 700 may be between the display panel 600 and the supporting member 800.

For example, the display panel 600 may include an upper substrate 611, a lower substrate 613, a lower polarizing member 615, and an upper polarizing member 617.

The upper substrate 611, a thin film transistor array substrate, may include a pixel array including a plurality of pixels in respective pixel areas defined by a plurality of gate lines and a plurality of data lines. Each of the plurality of pixels may include a thin film transistor electrically connected to the gate line or the data line, a pixel electrode connected to the thin film transistor, and a common electrode which is provided adjacent to the pixel electrode and is supplied with a common voltage.

The upper substrate 611 may further include a pad part in a first periphery portion thereof, and a gate driving circuit in a second periphery portion. Herein, the pad part may be formed with a plurality of patches, pads or traces.

The pad part may provide the pixel array and the gate driving circuit with a signal supplied from an outside. For example, the pad part may include a plurality of data pads connected to the plurality of data lines through a plurality of data link lines, and a plurality of gate input pads connected to the gate driving circuit via a gate control signal line. The first periphery portion of the upper substrate 611 including the pad part may protrude from a corresponding side surface of the first periphery portion of the lower substrate 613, and the pad part may be exposed in a reward direction toward the supporting member 800 may be exposed. For example, the upper substrate 611 may have a size which is greater than that of the lower substrate 613.

The gate driving circuit may, for example, be embedded (or integrated) into the second periphery portion of the upper substrate 611 so as to be connected to the plurality of gate lines in a one-to-one relationship. For example, the gate driving circuit may be a shift register including a transistor which is formed through the same process as a process of forming the thin film transistor in the pixel area. As another example, the gate driving circuit may be in a panel driving circuit without being embedded (or integrated) into the upper substrate 611.

The lower substrate 613, a color filter array substrate, may include a pattern (e.g., a pixel defining pattern) including an opening area overlapping each of the pixel areas disposed on the upper substrate 611 and a color filter layer in the opening area. The lower substrate 613 may have a size which is less than that of the upper substrate 611. For example, the lower substrate 113 may overlap a portion other than the first periphery portion of the upper substrate 111. The lower substrate 613 may be attached to the upper substrate 611 except for the first periphery portion of the upper substrate 611. The lower substrate 613 may be attached to the upper substrate 611 except for the first periphery portion of the upper substrate 611 with a liquid crystal layer using a sealant.

The liquid crystal layer may be between the upper substrate 611 and the lower substrate 613, and may include a liquid crystal molecules having an alignment direction which is changed based on electric fields generated from the common voltage and a data voltage applied to a pixel electrode in each pixel.

The lower polarizing member 615 is attached to a lower surface of the lower substrate 613 and may polarize light which is irradiated from the backlight 320 and travels to the liquid crystal layer. The upper polarizing member 617 is attached to an upper surface of the upper substrate 611 and may polarize light which passes through the upper substrate 611 and is output to the outside.

Accordingly, a display panel 600 according to embodiments of the present disclosure may drive the liquid crystal layer according to the electric field generated from the common voltage and the data voltage applied to the pixel electrode in each pixel, thereby displaying an image using light passing through liquid crystal layer. Accordingly, in the display panel 600 according to an embodiment of the present disclosure, since the upper substrate 611 which is a thin film transistor array substrate configures an image display surface, a whole front surface of the display panel 600 may be externally exposed without being covered by a separate structure or mechanism.

In a display panel 600 according to another embodiment of the present disclosure, the upper substrate 611 may be the color filter array substrate, and the lower substrate 613 may be the thin film transistor array substrate. Accordingly, the display panel 600 according to another embodiment of the present disclosure may have a configuration where an upper portion and a lower portion the display panel 600 according to an embodiment of the present disclosure are reversed therebetween. In this case, the pad part of the display panel 600 according to another embodiment may be covered by a separate structure or mechanism.

In some embodiments, the display apparatus 50 may further include a sealing member 650. The sealing member 650 may cover each side surface of the display panel 600. The sealing member 650 may cover each side surface and each corner of the display panel 600. The sealing member 650 may protect at least one side surface of the display panel 600 from external impact, or may prevent light from being leaked through the at least one side surface (i.e. "side surface light leakage") of the display panel 600. In some embodiments, the sealing member 650 may be formed of a silicon-based sealant or ultraviolet (UV)-curable sealant (or resin). The sealing member 650 may include the UV-curable sealant considering a process tact time. Further, in some embodiments, the sealing member 650 may have color (e.g., blue, red, cyan, or black). However, embodiments of the present disclosure are not limited thereto. For example, the sealing member 650 may be formed of a colored resin or light blocking resin for preventing the side surface light leakage.

In some embodiments, at least a portion of an upper surface of the sealing member 650 may be covered by the upper polarizing member 617. For example, the upper polarizing member 617 may include an extension portion which extends long from an outer surface of the upper substrate 611 to cover at least a portion of the front surface of the sealing member 650 and is attached to at least a portion of the front surface of the sealing member 650. Accordingly, a bonding surface (or a boundary portion) between the sealing member 650 and the upper substrate 611 may be concealed by the extension portion of the upper polarizing member 617 and may not be exposed at a forward region, at which a viewer is located, in front of the display apparatus. For example, the front surface of the display panel 600 may be exposed at the forward region FD in front of the display apparatus without being by a separate mechanism, and in case when the sealing member 650 is not provided, leakage of light through the surface of the display panel 600 may be prevented. Accordingly, the sealing member 650 may have, as a configuration of the display apparatus, a structure where the whole front surface of the display panel 600 is exposed at the forward region FD, for removing or minimizing a bezel width, i.e. an edge area, of the display apparatus.

In some embodiments, the backlight 320 may be disposed on the rear surface of the display panel 600 and may irradiate light to the rear surface of the display panel 600. The backlight 320 may include a light guide plate 324, a light source, a reflective sheet 322, and an optical sheet part 326.

The light guide plate 324 may be disposed to overlap the display panel 600, and include a light incident surface on a side wall thereof. The light guide plate 324 may include a light transmissive plastic or glass material. The light guide plate 324 may transfer (or output) light, which is incident through the light incident surface from the light source, to the display panel 600.

The light source may irradiate light to the light incident surface in the light guide plate 324. In some embodiments, the light source may include a plurality of light emitting diodes which are mounted on a light source printed circuit board and irradiate light to the light incident surface of the light guide plate 324. The light source may be disposed in the supporting member 800 to overlap the first periphery portion of the display panel 600.

The reflective sheet 322 may be disposed on the supporting member 800 such that the reflective sheet 322 covers the rear surface of the light guide plate 324. The reflective sheet 322 may reflect light, which is incident from the light guide plate 324, toward the light guide plate 324 to minimize the loss of the light.

The optical sheet part 326 may be on a front surface of the light guide plate 324 and may enhance a luminance characteristic of the light output from the light guide plate 324. In some embodiments, the optical sheet part 326 may include a lower diffusion sheet, a lower prism sheet, and an upper prism sheet. However, embodiments of the present disclosure are not limited thereto, the optical sheet part 326 may include one or more stacked combinations of one or more sheets among a diffusion sheet, a prism sheet, a dual brightness enhancement film, and a lenticular sheet, or may be configured with one composite sheet having a light diffusing function and a light collecting function.

The panel guide 900 may support a rear periphery portion of the display panel 600. The panel guide 900 may be supported by or accommodated into the supporting member 800. The panel guide 900 may be disposed under the rear periphery portion of the display panel 600 so as not to protrude to the outside of each side surface of the display panel 600. In some embodiments, the panel guide 900 may include a panel supporting part 910 and a guiding side wall 930. For example, the panel guide 900 may have a cross-sectional structure of "ㄱ" or "ㄷ" shape according a coupling or connection structure of the panel supporting part 910 and the guiding side wall 930, however, embodiments of the present disclosure are not limited thereto. In some embodiments, the panel guide 900 may be formed of a plastic material, a metal material, or a mixed material of a plastic material and a metal material, however, embodiments of the present disclosure are not limited thereto.

The panel supporting part 910 may be coupled or connected to at least one rear periphery portion of the display panel 600, and may be supported by the supporting member 800. The panel supporting part 910 may have a size smaller than or equal to the display panel 600 so as not to protrude from the outside of each side surface of the display panel 600. The panel supporting part 910 may directly contact the uppermost surface (or the uppermost portion of the upper surface) of the backlight 320, for example, the top surface (or the most top portion of the top surface) of the optical sheet 326, or may be spaced apart from the top surface (or the uppermost portion of the top surface) of the backlight 320 by a certain distance.

The guide sidewall 930 may surround all or at least one portion of at least one side surface of the supporting member 800, and may be connected to the panel supporting part 910. For example, the guide sidewall 930 may be bent from the panel supporting part 910 to all or at least one of side surfaces of the supporting member 800, and may surround all or at least one of the side surfaces of the supporting member 800.

In some embodiments, the panel guide 900 may be coupled or connected with at least one periphery portion of the rear surface of the display panel 600 through a panel connecting member 950. The panel connection member 950 may be between at least one portion of the rear surface of the display panel 600 and the panel supporting part 910 of the panel guide 900, and may couple or connect the display panel 600 to the panel guide 900. In some embodiments, the panel connecting member 950 may include an acrylic or urethane-based adhesive. For example, among acrylic and urethane-based adhesive, the panel connecting member 950 may include an acrylic-based adhesive which is a relatively better in adhesive force and hardness so that vibration of the panel guide 900 may be transferred to the display panel 600. For example, the panel connecting member 950 may include an acrylic-based double-sided adhesive pad or an acrylic-based adhesive resin curing layer.

In some embodiments, the front surface of the panel connecting member 950 may be coupled or connected to the lower substrate 613 of the display panel 600 or the lower polarizing member 615 and, in an exemplary embodiment, may be directly coupled or connected to at least one periphery portion of the rear surface of the lower substrate 613 in order to improve adhesive force with the display panel. For example, as the panel connecting member 950 is attached to the at least one periphery portion of the rear surface of the lower substrate 613 and surround at least one side surface of the lower polarizing member 615, it is possible to prevent side surface light leakage from occurring in the lower polarizing member 615.

The supporting member 800 may cover all or at least portion of the rear surface of the display panel 900 while supporting the panel guide 900. The supporting member 800 may support one or more of the rear surface or at least one side surface of the display panel 600.

The supporting member 800 may be, for example, a cover bottom. For example, a middle cabinet may be included which supports the display panel 600 by being accommodated in at least one edge portion of the display panel 100 so that the middle ca, in order to surround at least one lateral surface or side surface of the display panel 600, be coupled to the cover bottom, and support the display panel 600. For example, the middle cabinet may have a cross section in the shape of a "ㅓ". The supporting member 800 may include the cover bottom, or the cover bottom and the middle cabinet, however, embodiments of the present disclosure are not limited thereto. The supporting member 800 may include any structure, mechanism, element, or configuration capable of supporting the side surface or the rear surface of the display panel 600.

The supporting member 800 may be in the shape of a plate formed along or over all or the rear surface of the display panel 600. For example, the supporting member 800 may cover the entire of the rear surface of the display panel 600 while being spaced apart therefrom by a certain distance. The supporting member 800 may have the shape of a plate plate formed of glass, metal, or plastic. For example, an edge or sharp edge portion of the supporting member 800 may have a slope shape or a curved shape, e.g., a chamfering process or a corner rounding process. For example, the supporting member 800 formed of glass may be sapphire glass. For example, the supporting member 800 formed of metal may be formed of one or more of aluminum, an aluminum alloy, a magnesium alloy, and an alloy of iron and nickel. As another example, the supporting member 800 may have a stacked structure of a glass plate facing the rear surface of the display panel 600 while having a relatively thin thickness than the metal plate and the glass plate. For example, the rear surface of the display apparatus 50 may be used as a mirror surface by the metal plate. However, embodiments of the present disclosure are not limited to these materials or shapes.

The supporting member 800 herein may be referred to as, such as, a cover bottom, a plate bottom, a back cover, a base frame, a metal frame, a metal chassis, a chassis base, an m-chassis, or the like. Accordingly, the supporting member 800 may include any type of frame or plate-like structure disposed on the rear surface of the display apparatus as a structure, mechanism, unit/element, or configuration for supporting the display panel 600.

The display apparatus 50 according to embodiments of the present disclosure may further include a system rear cover 850. The system rear cover 850 may accommodate the display panel 600 and surround one or more side surfaces of the display panel 600. In some embodiments, the system rear cover 850 may include a rear surface part 851 and a side surface part. The rear surface part 851 is an outermost rear mechanism or structure on the rear surface of the display apparatus 50, and may support (or accommodate) the display panel 600 and cover the rear surface of the display panel 600. The side surface part 853 is an outermost side mechanism or structure on at least one side surface of the display apparatus 50, and may cover at least one side surface of the display panel 600 by being disposed in at least an edge portion of the rear surface part 851.

The vibration generation device 700 may include a first portion 701 and a second portion 702. The vibration generation device 700 may be referred to as an actuator, an exciter, a transducer, a film type vibration generation device, or a piezoelectric type vibration generation device; however, embodiments of the present disclosure are not limited thereto. The vibration generation device 700 below will be discussed with reference to FIGS. 15 and 16.

With reference to FIG. 13, the vibration generation device 700 may be disposed between the display panel 600 and the supporting member 800. For example, the vibration generation device 700 may be between the display panel 600 and the backlight 320. When the vibration generation device 700 is on the rear surface of the display panel 600, there have been a problem in which vibration of the vibration generation device 700 is not desirably provided to the display panel 600 due to a structure, mechanism, unit/element, or configuration between the display panel 600 and the supporting member 800, such as, the backlight 320, or the like. According to embodiments of the present disclosure, since the vibration generation device is implemented between the display panel 600 and the backlight 320, it is possible for desired vibrations to reach a front surface, structure or part. When a touch sensor is mounted or embedded on the display panel 600, since the vibration of the vibration generation device 700 may cause the touch sensor to vibrate, it is possible to implement efficiently haptic vibration/feedback.

FIGS. 14A to 14D illustrate a display apparatus in accordance with another embodiment of the present disclosure.

With reference to FIGS. 14A to 14D, the display apparatus (70, 75, 80, 85) according to embodiments of the present disclosure may include a front member 815, the display panel, and the vibration generation device 700.

The front member 815 includes a structure, mechanism, unit/element, or configuration a foremost of the display apparatus (70, 75, 80, 85), and may protect a screen of the display panel. The front member 815 may be disposed on a front surface of display panel. For example, the front member 815 may cover (or overlay) the front surface of the display panel to protect the display panel from an external impact. Further, the front member 815 may vibrate along with the vibration of the vibration generation device 700 to generate sound SW.

In some embodiments, the front member 815 may include a transparent plastic material, a glass material, or a tempered glass material. For example, the front member 815 may include one of sapphire glass and gorilla glass or stacked structure thereof, but is not limited thereto. As another example, the front member 815 may include a transparent plastic material such as polyethyleneterephthalate (PET), or the like. The front member 815 may include tempered glass in based on a scratch resistance and transparency. For example, the front member 815 may be a front structure, a front window, a cover window, a glass window, a cover screen, a screen cover, a window glass, or the like, however, embodiments of the present disclosure are not limited thereto.

In some embodiments, the front member 815 may have a polygonal shape such as a rectangular shape or a square shape, or may have a non-polygonal shape including at least one side having a curved shape.

The display panel may be disposed on the rear surface (or at least one rear portion or a back surface) of the front member 815, and may display images. The display panel may serve as a touch sensor that senses a user touch on the front member 815. The display panel may output sound SW or generate haptic feedback (or haptic vibration) in response to a user touch according to the vibration of the vibration generation device 700. For example, the vibration generation device 700 may be a sound generator for outputting sound. For example, the vibration generation device 700 may be a haptic device capable of generating haptic feedback or haptic vibration.

The display panel may include a self-emitting display panel or a curved self-emitting display panel. For example, the display panel may include a light emitting display panel, a micro light emitting diode display panel, a flexible light emitting display panel, or a flexible micro light emitting diode display panel, however, embodiments of the present disclosure are not limited thereto.

In some embodiments, the display panel may have a polygonal shape such as a rectangular shape or a square shape, or may have a non-polygonal shape including at least one side having a curved shape. The display panel may have a shape that is the same as or different from that of the front member 815. For example, the front member 815 may have a rectangular shape, and the display panel may have a rectangular shape having a size that is less than that of the front member 815. As another example, the front member 815 have a non-polygonal shape, and the display panel may have a non-polygonal shape or a rectangular shape having a size that is is less than that of the front member 815.

In some embodiments, the display panel may include a pixel array substrate 812 including a pixel array layer including a plurality of pixels, and an encapsulation layer 813 covering the pixel array layer.

The pixel array substrate 812 may include a base substrate and a pixel array layer over the base substrate. The base substrate may include plastic material or glass material. The pixel array layer may include a pixel array including a plurality of pixels provided in a display area or active area over the base substrate.

Each of the plurality of pixels may be provided in each area defined by pixel driving lines including a plurality of gate lines and a plurality of data lines. In some embodiments, each of the plurality of pixels may include a pixel circuit including at least two thin film transistors and at least one capacitor, and a light emitting element layer that emits light with currents/voltages supplied from the pixel circuit.

The light emitting element layer in each pixel may include a first electrode connected to corresponding pixel circuit, a light emitting element on the first electrode, and a second electrode on the light emitting element. For example, the light emitting element may include an organic light emitting layer or a quantum dot light emitting layer. As another example, the light emitting element may include a micro light emitting diode, however, embodiments of the present disclosure are not limited thereto.

In some embodiments, the light emitting element layer may have a top emission structure or a front emission structure where light emitted from the light emitting element passes through the encapsulation layer 813 and transferred toward the front member 815. For example, in the light emitting element layer based on the top emission structure (or the front emission structure, the first electrode may be a reflective electrode and the second electrode may be a transparent electrode. For example, the first electrode may include a light reflecting material and the second electrode may include a light transmitting material.

In another embodiment, the light emitting element layer may have a bottom emission structure or a rear emission structure where light emitted from the light emitting element passes through the pixel array substrate 812 and is transferred toward the front member 815. For example, in the light emitting element layer based on the bottom emission structure (or the rear emission structure, the first electrode may be a transparent electrode and the second electrode may be a reflective electrode. For example, the first electrode may include a light transmitting material and the second electrode may include a light reflecting material. However, embodiments of the present disclosure are not limited thereto. For example, the light emitting element layer may have a double-sided or dual emission structure.

The encapsulation layer 813 may be disposed over the array substrate 812 to surround the pixel array layer, and thus, may prevent or block penetration of oxygen and/or moisture into the light emitting element of the pixel array layer. In some embodiments, the encapsulation layer 813 may have a multilayer structure where an organic material layer and an inorganic material layer are alternately stacked, however, embodiments of the present disclosure are not limited thereto. The inorganic material layer may prevent or block penetration of oxygen and/or moisture into the light emitting element. The organic material layer may have a thickness that is thicker than the inorganic material layer, so as to cover particles occurring in a manufacturing process, however, embodiments of the present disclosure are not limited thereto.

In some embodiments, the display panel may further include a protective substrate over the encapsulation layer 813. The protective substrate (or encapsulation substrate) may be disposed on or coupled to the front surface of the encapsulation layer 813 by a filler or an adhesive. For example, the protective substrate may be formed of a transparent material when the light emitting element layer has the top emission structure. As another example, the protective substrate may be formed of a transparent material, an opaque material, or a metal material when the light emitting element layer has the bottom emission structure. For example, when the light emitting element layer has the top emission structure, the protective substrate may not be disposed.

In some embodiments, the display apparatus may further include a polarizing member 825. The polarizing member 825 may be a polarizing film for improving the visibility and contrast ratio of the display panel by preventing or minimizing reflection of external light. The polarizing member 825 may prevent or minimize reflection of external light by changing external light reflected by a thin film transistor and/or pixel driving lines over the pixel array substrate 812 to a circularly polarized state.

Figure 14A:
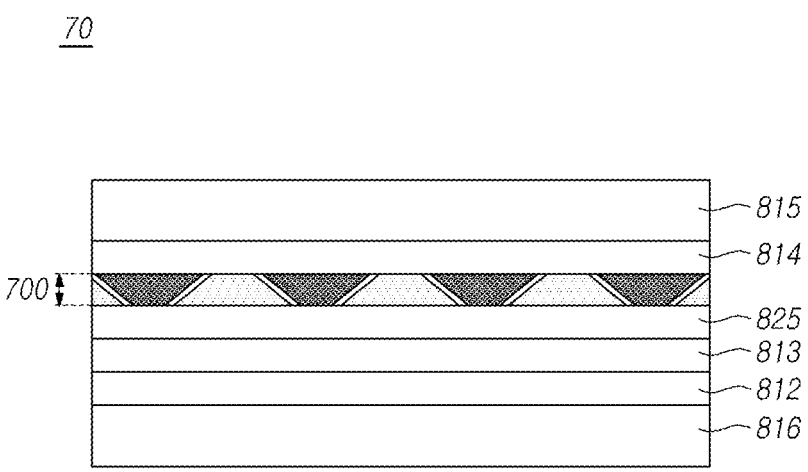
FIGS. 14A to 14D are views illustrating a display apparatus in accordance with another embodiment of the present disclosure.
Figure 14B:
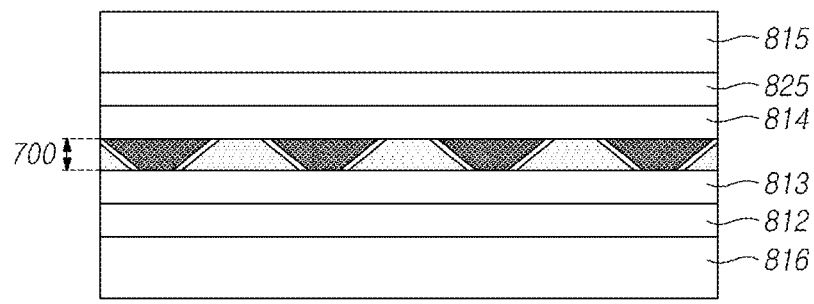
Figure 14C:
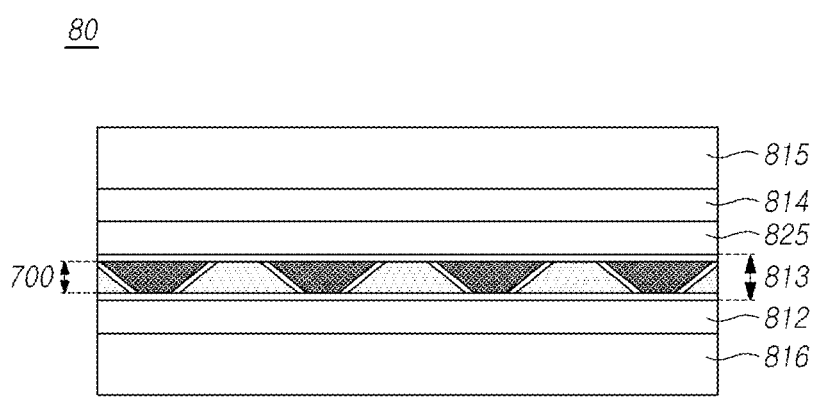
Figure 14D:
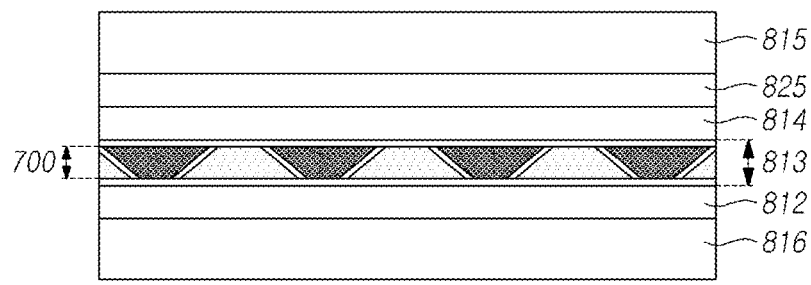

As illustrated in FIGS. 14A and 14C, in some embodiments, when the light emitting element layer has the top emission structure, the polarizing member may be disposed on the encapsulation layer 813 through a transparent adhesive. When the display apparatus 70 includes the polarizer, the protective substrate may not be needed. For example, the transparent adhesive may include a pressure sensitive adhesive (PSA), an optically clear adhesive (OCA), or an optically clear resin (OCR), however, embodiments of the present disclosure are not limited thereto. In another example, as illustrated in FIGS. 14B and 14D, the polarizing member may be disposed between the front member 815 and the encapsulation layer 813.

As another example, when the light emitting element layer has the bottom emission structure, the polarizing member may be disposed (or bonded) to the rear surface of the pixel array substrate 812 through a transparent adhesive.

In some embodiments, the display apparatus (70, 75, 80, 85) may further include a touch sensor 814 for sensing a touch or a proximity touch of a user on the front member 815.

The touch sensor 814 may include a touch electrode layer. The touch electrode layer may include a plurality of touch electrodes for sensing a touch or a proximity touch of a user. The plurality of touch electrodes may serve as a touch sensor for sensing a touch or a proximity touch of a user based on a mutual capacitance scheme or a self capacitance scheme.

In some embodiments, the touch sensor 814 may be implemented as a touch panel including a plurality of touch electrodes. For example, an add-on type touch panel may be disposed or attached on the encapsulation layer 813 or the polarizing member 825 when the light emitting element layer has the top emission structure, and disposed or attached over the rear surface of the pixel array substrate 812 when the light emitting element layer has the bottom emission structure.

In another embodiment, the touch sensor may be directly disposed on the encapsulation layer 813 according to an in-cell type. For example, the in-cell type touch sensor may be directly disposed on the front surface of the encapsulation layer 813 when the light emitting element layer has the top emission structure.

In some embodiments, the display panel may further include a color filter layer 813 to overlap with each of the plurality of pixels. The light emitting element disposed in each of the plurality of pixels may emit white light. For example, the color filter layer may be disposed on the encapsulation layer 813 when the light emitting element layer has the top emission structure. As another example, the color filter layer may be disposed in the pixel array layer when the light emitting element layer has the bottom emission structure.

In some embodiments, the display panel may further include a back plate 816. The back plate 816 may have a same shape as that of the pixel array substrate 812. For example, when the light emitting element layer has the top emission structure, the back plate 816 may be on the rear surface (or at least one rear portion) of the pixel array substrate 812 by a transparent adhesive. As another example, when the light emitting element layer has the bottom emission structure, the back plate may be the protective substrate. For example, the transparent adhesive may include a pressure sensitive adhesive (PSA), a optically clear adhesive (OCA), or an optically clear resin (OCR), however, embodiments of the present disclosure are not limited thereto.

The back plate 816 may increase rigidity or stiffness of the display panel and dissipate heat that occurs in the display panel. In some embodiments, the back plate 816 may include a metal material having a high thermal conductivity. For example, the back plate 816 may be formed of one or more of aluminum, copper, silver, and magnesium, or may include an alloy material thereof, or may include a stainless steel material, however, embodiments of the present disclosure are not limited thereto. The back plate 816 may be a heat diffusion sheet, a heat diffusion layer, a heat diffusion plate, a heat sink, a heat dissipation sheet, a heat dissipation layer, or a heat dissipation plate, or the like, however, embodiments of the present disclosure are not limited thereto.

With reference to FIGS. 14A to 14D, the vibration generation device 700 may be between the display panel and the front member 815. For example, the vibration generation device 700 may be between the front member 815 and the polarizing member 825. For example, the vibration generation device 700 may be over the polarizing member 825. For example, the vibration generation device 700 may be over the encapsulation layer 813. For example, the vibration generation device 700 may be disposed between the front member 815 and the encapsulation layer 813. When the vibration generation device 700 is on the rear surface of the display panel, there have been a problem in which vibration of the vibration generation device 700 is not desirably provided to the display panel due to a structure, mechanism, unit/element, or configuration between the display panel 810 and the front member 815, such as, the pixel array substrate 812, the encapsulation layer 813, or the like. According to embodiments of the present disclosure, since the vibration generation device is implemented between the display panel and the front member 815, it is possible for desired vibrations to reach the front member. Since the touch sensor 814 is located in proximity of the vibration generation device 700, it is possible to cause the touch sensor 814 to vibrate by the vibration of the vibration generation device 700 and to implement efficiently haptic vibration/feedback.

With reference to FIGS. 14C and 14D, the vibration generation device 700 may be in the encapsulation layer 813. The encapsulation layer 813 may be an encapsulation substrate or a second substrate. For example, the vibration generation device 700 may be accommodated in adhesive in the encapsulation layer 813. The adhesive may bond or attach the pixel array layer 812 and the encapsulation substrate or the second substrate, which is the encapsulation layer 813. The adhesive may be a pressure sensitive adhesive (PSA), an optical clear adhesive (OCA), or the like, however, embodiments of the present disclosure are not limited thereto. For example, the adhesive may include an adhesive material, such as epoxy, acryl, silicon, urethane, or the like. In some embodiments, the adhesive may further include a getter material capable of adsorbing moisture and/or oxygen; thereby, it is possible to improve reliability of the display panel.

For external, since the encapsulation layer 813 covers the vibration generation device 700, it is possible to prevent or minimize vibration performance deterioration (or sound performance deterioration) due to breakage and damage of the vibration generating apparatus 700 caused by external impact.

Accordingly, the display apparatus (80, 85) according to embodiments of the present disclosure may output sound to the front of the display apparatus or generate haptic vibration in response to a touch input or event, by vibrating according to the operation of the integrated or embedded vibration generation device 700. For example, the vibration generation device 700 may be a sound generator for outputting sound. For example, the vibration generation device 700 may be a haptic device capable of generating haptic feedback or haptic vibration. In the display apparatus (80, 85) according to another embodiment of the present disclosure, the vibration generation device 700 is integrated into the encapsulation substrate that is the encapsulation layer 813. As the vibration generation device 700 and the encapsulation substrate are united into one component, it is possible to simplify the process, and prevent the breakage of the vibration generation device 700 occurred during the process. Further, in the display apparatus (80, 85) according to another embodiment of the present disclosure, since the vibration generation device 700 accommodated into the inside of the encapsulation substrate that is the encapsulation layer 813 or the inside of the adhesive, appearance design may be improved and slimmed.

Figure 15:
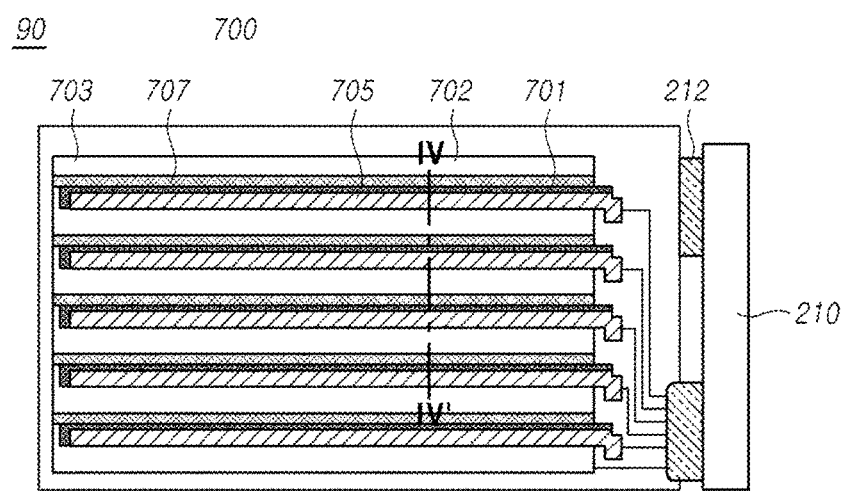
FIG. 15 is a view illustrating a vibration generation device in accordance with another embodiment of the present disclosure.
Figure 16:
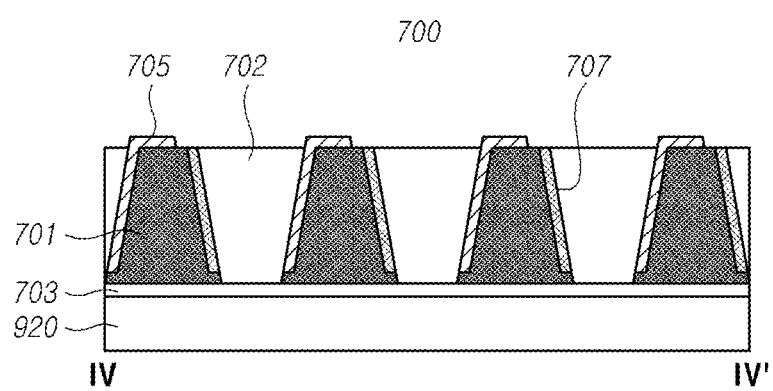
FIG. 16 is a cross-sectional view taken along IV-IV' shown in FIG. 15.

FIG. 15 illustrates a vibration generation device according to another embodiment of the present disclosure. FIG. 16 is a cross-sectional view taken along IV-IV' in FIG. 15.

With reference to FIGS. 15 and 16, a display apparatus 90 according to another embodiment of the present disclosure may include a vibration generation device 700, a touch driver 210, and a touch sensor connection part 212.

The vibration generation device 700 may include a substrate 920, a plurality of first portions 701 over the substrate 920, and a plurality of second portions 702 each between the plurality of first portions 701, such as between two first portions 701. Each of the plurality of first portions 701 may include a polygonal pattern. For example, each of the plurality of first portions 701 may be a line pattern having a predetermined width (or an interval or a distance), however, embodiments of the present disclosure are not limited thereto. For example, each of the plurality of first portions 701 may have various shapes according to thickness, width, pitch, and the like. The plurality of first portions 701 may be disposed to be spaced apart from one another by a predetermined width (or an interval or a size). For example, all of the plurality of first portions 701 may have an equal size to one another, for example, a length, a width, an area, or a volume, within a margin of error (or tolerance) generated in a manufacturing process.

The first portions 701 may have piezoelectric characteristics, and the second portions 702 each between the first portions 701 may have flexibility or transparency. For example, each of the plurality of first portions 701 may include an inorganic material or a piezoelectric material that vibrates by piezoelectric effects (or piezoelectric characteristics) with an electric field. For example, the plurality of first portions 701 may include an electroactive material. The electroactive material may have characteristic in which as pressure is applied to, or twisting occurs in, a crystalline structure due to an external force, a potential difference is caused by dielectric polarization based on a relative position change of a positive (+) ion and a negative (−) ion, and a vibration is generated due to an electric field on an applied voltage. For example, the plurality of first portions 701 may be referred to as an electrical active portion, an inorganic material portion, a piezoelectric material portion, or a vibration portion, however, embodiments of the present disclosure are not limited thereto.

Each of the plurality of first portions 701 may be formed of a ceramic-based material capable of relatively high vibration or may be formed of a piezoelectric ceramic having a perovskite-based crystalline structure. The perovskite crystalline structure has piezoelectric and inverse piezoelectric effects, and may be a plate-shaped structure having orientation. The perovskite crystalline structure may be represented by a chemical formula of ABOx, where A may be a divalent metal element, and B may be a tetravalent metal element. For example, A and B may be cations, and O may be anions. For example, the perovskite crystalline structure may include at least one of lead(II) titanate ($PbTiO_3$), lead zirconate ($PbZrO_3$), barium titanate ($BaTiO_3$), and strontium titanate ($SrTiO_3$), however, embodiments of the present disclosure are not limited thereto.

When the perovskite crystalline structure includes a center ion, for example, $PbTiO_3$, a position of a titanium (Ti) may be changed by by external stress or a magnetic field. Thus, polarization may be changed, thereby generating piezoelectric effects. For example, in the perovskite crystalline structure, it is possible to produce piezoelectric effects by being changed from a cubic shape corresponding to a symmetric structure into a tetragonal (e.g., quadrilateral) shape, an orthorhombic shape, or a rhombohedral shape etc., corresponding to an unsymmetrical structure, based on external stresses or magnetic fields. Since the polarization is high and the rearrangement of the polarization is easy in the morphotropic phase boundary of a tetragonal shape and a rhombohedral shape, which have a unsymmetrical structure, thus, these shapes cause high piezoelectric characteristics to be produced.

The inorganic material part in each of the plurality of first portions 701 may include one or more of lead (Pb), zirconium (Zr), titanium (Ti) zinc (Zn), nickel (Ni), manganese (Mn), and niobium (Nb), however, embodiments of the present disclosure are not limited thereto.

As another example, the inorganic material portion in each of the plurality of first portions 701 may include a lead zirconate titanate ($PbZrTiO_3$) based material including lead (Pb), zirconium (Zr), and titanium (Ti), or a lead zirconate nickel niobate (PZNN) based material including lead (Pb), zinc (Zn), nickel (Ni), manganese (Mn), and niobium (Nb); however, embodiments of the present disclosure are not limited thereto. Further, the inorganic material portion may include at least one of $CaTiO_3$, $BaTiO_3$, and $SrTiO_3$ without lead (Pb); however, embodiments of the present disclosure are not limited thereto.

Each of the plurality of second portions 702 may include a polygonal pattern. Each of the plurality of second portions 702 may be between the plurality of first portions 701. Each of the plurality of first portions 701 and each of the plurality of second portions 702 may be disposed (or arranged) on the same plane (or the same layer) in parallel. Each of the plurality of second portions 702 may be disposed to fill a gap between two adjacent first portions 701, therefore, may be connected or attached to each or all of the adjacent first portions 701. For example, each of the plurality of second portions 702 may be disposed to have a predetermined width (or size), and the plurality of second portions 702 may be disposed in parallel with one another such that one first portions 701 is between two second portions 702. All of the plurality of second portions 702 may have the same size, for example, a length, a width, an area, or a volume, within a process error range (e.g., an allowable error or a tolerance) occurring in a manufacturing process.

The organic material portions formed in each of the plurality of second portions 702 may be formed of an organic material or an organic polymer having flexible properties compared to the inorganic material portion, which is the first portion 701. For example, each of the plurality of second portions 702 may include an organic material, an organic polymer, an organic piezoelectric material, or an organic non-piezoelectric material. For example, each of the plurality of second portions 702 may be referred to as an adhesive, an adhesive portion, an elastic portion, a bending portion, a damping portion, or a flexible portion having transparency or flexibility, however, embodiments of the present disclosure are not limited thereto. Accordingly, since the plurality of second portions 702 of the vibration generation device according to embodiments of the present disclosure has flexibility, the vibration generation device may be used in a flexible display apparatus, for example, a curved display apparatus that is bent at a predetermined radius of curvature. Embodiments of the present disclosure are not limited thereto; the vibration generation device may be used in a rollable display apparatus that may be wound in a spiral form, a bendable display apparatus, a wearable display apparatus that is wound around a wrist, or the like. The bendable display apparatus may be an edge bending display apparatus, a bezel bending display apparatus, or an active bending display apparatus; however, embodiments of the present disclosure are not limited thereto.

The organic material portion may include at least one of an organic piezoelectric material and an organic non-piezoelectric material. The organic material portion including the organic piezoelectric material may improve the overall durability of the vibration generation device 700 by absorbing an impact applied to the inorganic material portion (or the first portion), and may provide a certain level of piezoelectric properties/characteristics. For example, the organic piezoelectric material may be an organic material having electroactive properties/characteristics. For example, the organic piezoelectric material may include one or more of a PVDF polymer doped with Polyvinylidene fluoride (PVDF), β-Polyvinylidene fluoride (β-PVDF), polyvinylidene-trifluoroethylene (P(VDF-TrFE)), polyvinylidene-trifluoroethylene-chlorofluoroethylene (P(VDF-TrFE-CFE)), Polyvinylidene-trifluoroethylene-chlorotrifluoroethylene(P(VDF-TrFE-CTFE)), carbon nanotube (CNT), or the like, and a phosphazene-based polymer; however, embodiments of the present disclosure are not limited thereto. For example, the phosphazene-based polymer may be poly-bis(trifluoroethoxy) phosphazene; however, embodiments of the present disclosure are not limited thereto.

Since the organic material portion including the organic non-piezoelectric material is formed of the curable resin composition and the adhesive including the same, it is possible to improve overall durability of the vibration generation device 700 by absorbing the impact applied to the inorganic material portion (or the first portion). For example, the organic non-piezoelectric material may include at least one of an epoxy based polymer, an acrylic based polymer, and a silicone based polymer, embodiments of the present disclosure are not limited thereto. Accordingly, since the first portion 701 formed of an inorganic material and having a piezoelectric characteristic and the second portion 702 formed of an organic material and having a transparency are alternately connected to each other, it is possible to have a thin film shape, and have a size corresponding to the display panel of the display apparatus or have a size capable of realizing a vibration characteristic or sound characteristic configured to the display panel.

When the vibration generation device 700 is applied to a touch sensor, such as a fingerprint sensor or a force sensor, it is possible to improve touch performance and transparency by forming the first portion 701, which is an opaque metal material, in a mesh form or a stripe form and improve visibility and transmittance by adjusting a height (or a thickness) or a size (or a width) of the first portion 701. The first portion 701 may be patterned by at least one of wire sawing, scribing, blade dicing, laser cutting, stealth dicing, thermal laser separation (TLS), and photo etching process; however, embodiments of the present disclosure are not limited thereto. In order to implement the vibration generation device 700 having transparency, a size of the second portion 702 may be the same as or different from a size of the first portion 701. The size of the second portion 702 may be a distance or pitch between two first portions 701. For example, the pitch may be two times to three times or more than the size of the first portion 701; however, embodiments of the present disclosure are not limited thereto. For example, the size of the second portion 702 may be two times to three times or more than the size of the first portion 701; however, embodiments of the present disclosure are not limited thereto.

As another example, when the vibration generation device 700 is applied to a vehicle, a portion for blocking light may be configured as the first portion 701, and an opening portion may be configured as the second portion 702. Since the second portion 702 includes an organic material having transparency, it is possible to prevent image reflecting caused by light from the outside in the vehicle discussed with reference to FIG. 2, and thus the vibration generation device 700 may be used as a light control device. For example, in order to implement the vibration generation device 700 as a light control device having transparency, a size of the second portion 702 may be greater than the size of the first portion 701. For example, the size of the second portion 702, such as a pitch, may be two times to five times or less than the size of the first portion 701; however, embodiments of the present disclosure are not limited thereto. For example, the thickness of the second portion 700 may be two times to four times or less than the thickness of the first portion 702; however, embodiments of the present disclosure are not limited thereto. For example, when the size of the second portion 702 is 20 µm to 80 µm, the thickness of the vibration generation device 700 may be 40 µm to 320 µm. For example, when the size (or width) of the first portion 701 is 20 µm to 30 µm or less, the size of the second portion 702 may be 20 µm to 180 µm. When the first portion 701 has a size capable of controlling light, for example, a size of a black matrix of the display apparatus, and the size of the second portion 702 is two times to four times of the thickness of the vibration generation device 700, it is possible to provide a vibration generation device capable of having transparency and vibration characteristics (or haptic characteristics).

As another example, in order for the vibration generation device 700 to be implemented as a haptic device or a sound generation device, the size of the first portion 701 may be greater than the size of the second portion 702. For example, the size of the first portion 701 may be two times to six times or more than the size of the second portion 702. For example, when the size of the second portion 702 is 10 µm to 1000 µm or less, the size of the first portion 701 may be 20 µm to 1200 µm.

The first electrode 703 may be disposed on a lower surface of the vibration generation device 700. For example, the first electrode 703 is disposed on first surfaces (or front surfaces) of the first portion 701 and the second portion 702 and may be electrically connected to the first surface of each of the plurality of first portions 701. For example, the first electrode 703 may be formed of a transparent conductive material, a translucent conductive material, or an opaque conductive material. For example, the transparent or translucent conductive material may include indium tin oxide (ITO) or indium zinc oxide (IZO); however, embodiments of the present disclosure are not limited thereto. The opaque conductive material may include aluminum (Al), copper (Cu), gold (Au), nickel (Ni), silver (Ag), molybdenum (Mo), nickel-phosphorus (Ni—P), tungsten (W), platinum (Pt), magnesium (Mg), silver nanowire (Ag nanowire), CarbonNanoTube (CNT), graphene, PEDOT:PSS (poly (3,4-ethylenedioxythiophene):polystyrene sulfonate), or may be formed of one or more alloys thereof, embodiments of the present disclosure are not limited thereto.

A third electrode 705 may be disposed on a side surface of the first portion 701. For example, the third electrode 705 may be disposed on a side surface of the first portion 701 and an upper surface of a second surface different from a first surface on which the first electrode 701 is disposed. Therefore, since the third electrode 705 is disposed on one surface of the first portion 701, the light transmittance and vibration characteristics may be improved. The third electrode 705 may be individually connected to the touch sensor connection part 212. The third electrode 705 may receive a signal according to a signal input from the touch driver 210.

A fourth electrode 707 may be disposed on another side surface of the first portion 701. For example, the fourth electrode 707 may be disposed on a different side surface from the side surface on which the third electrode 705 is disposed. The fourth electrode 707 may be used as a charging electrode of the third electrode 705 by being attached to the first electrode 703.

The third and fourth electrodes 705 and 707 may be formed of a metal material. For example, the third electrode 705 and the fourth electrode 707 may include aluminum (Al), copper (Cu), gold (Au), nickel (Ni), silver (Ag), molybdenum (Mo), nickel-phosphorus (Ni—P), tungsten (W), platinum (Pt), magnesium (Mg), silver nanowire (Ag nanowire), CarbonNanoTube (CNT), graphene, PEDOT:PSS, or the like, or may be formed of one or more alloys thereof, embodiments of the present disclosure are not limited thereto.

The touch driver connected to the touch electrode layer of the touch sensor of the display panel may be connected to the third electrode 705 of the vibration generation device. For example, the touch driver may be connected to the third electrode 705 of the vibration generation device 700 by anisotropic film bonding; however, embodiments of the present disclosure are not limited thereto. When a signal is generated in the touch sensor of the display panel, the touch driver 210 can transmit this signal to the vibration generation device 700 after having recognized the signal. When receiving this signal, the vibration generation device 700 can vibrate according to this signal.

As described with reference to FIG. 4, the vibration generation device may further include a protective film. A first protective film 142 may be disposed on the first electrode 703, and protect the first surfaces of the first portion 701 and the second portion 702. For example, the first protective film may be a polyimide (PI) film or a polyethyleneterephthalate (PET) film; however, embodiments of the present disclosure are not limited thereto.

A second protective film 144 may be disposed on the second electrode 704, and protect the second surfaces of the first portion 701 and the second portion 702. For example, the second protective film may be a polyimide (PI) film or a polyethyleneterephthalate (PET) film; however, embodiments of the present disclosure are not limited thereto.

Figure 17:
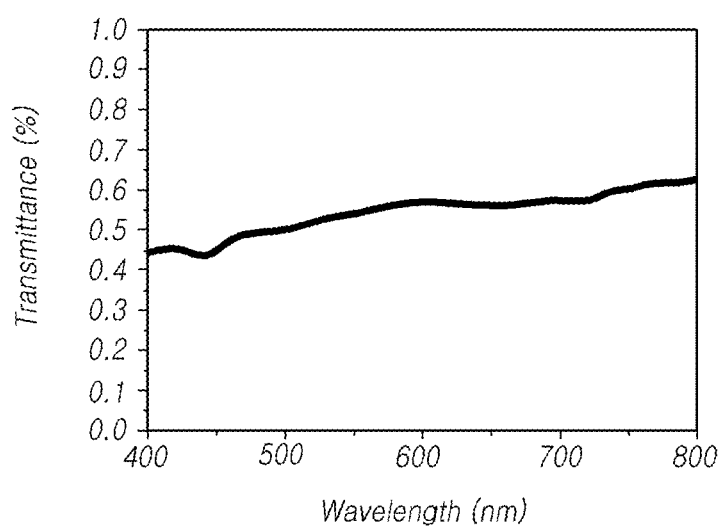
FIG. 17 illustrates a view resulted from measuring the transmittance of a vibration generation device in accordance with an embodiment of the present disclosure.

FIG. 17 illustrates a transmittance of a vibration generation device according to another embodiment of the present disclosure.

With reference to FIG. 17, in the vibration generation device of FIGS. 15 and 16, the first portion 701 is formed of PVDF, and the size of the first portion 701 is 30 μm; and the second portion 702 is formed of epoxy series, and the second portion 702 has a size of 90 μm and a thickness of 300 μm. However, embodiments of the present disclosure are not limited thereto. In FIG. 17, the horizontal axis represents wavelength (nm) and the vertical axis represents transmittance (%). The transmittance was measured using JCH300S of J&C Tech Co. The transmittance can be measured such that condensing beam from a light source is incident to an integrating sphere by passing through the vibration generation device, and the light separated from the integrating sphere is reflected and collected by a detector to obtain a measured value; however, embodiments of the present disclosure are not limited thereto. In FIG. 17, the transmittance of 100% is represented as 1.0.

With reference to FIG. 17, it may be seen that the transmittance of about 60% appears in 400 nm to 800 nm, which is wavelength region of the entire light. Accordingly, according to embodiments of the present disclosure, it is possible to provide a vibration generation device with improved transmittance; therefore, vibration generation device may be used as a light control device.

Figure 18:
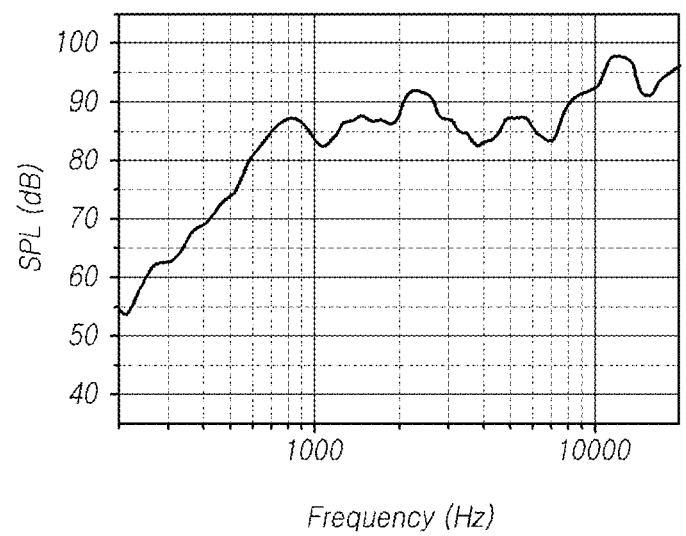
FIG. 18 illustrates a view resulted from measuring sound characteristics of a vibration generation device in accordance with an embodiment of the present disclosure.

FIG. 18 illustrates sound characteristics of a vibration generation device according to another embodiment of the present disclosure.

With reference to FIG. 18, in the vibration generation device of FIGS. 15 and 16, the first portion 701 is formed of lead zirconate titanate (PZT; PbZrO$_3$) based ceramic material, and the size of the first portion 701 is 30 μm; and the second portion 702 is formed of epoxy resin-based material, and the second portion 702 has a size of 90 μm and a thickness of 300 μm. However, embodiments of the present disclosure are not limited thereto. In FIG. 18, the horizontal axis represents a frequency (Hz), and the vertical axis represents a sound pressure level (SPL, dB). Using sound pressure characteristics of APx525 from Audio Precision, Inc., the sound pressure was measured at a position 10 cm away from the display panel and the vibration generation device while a sine sweep was applied at 200 Hz to 20 kHz.

With reference to FIG. 18, in the vibration generation device according to embodiments of the present disclosure, it may be seen that the sound pressure appears in the low to high sound frequency ranges. Therefore, when the vibration generation device is applied to the display apparatus, the display apparatus with improved sound pressure can be provided. For example, the vibration generation device may be used as a speaker of the display apparatus or a speaker of a vehicle. For example, the low sound frequency range may be 200 Hz or less, the mid sound frequency range may be 200 Hz to 3 kHz, and the high sound frequency range may be 3 kHz or more; however, embodiments of the present disclosure are not limited thereto.

Figure 19:
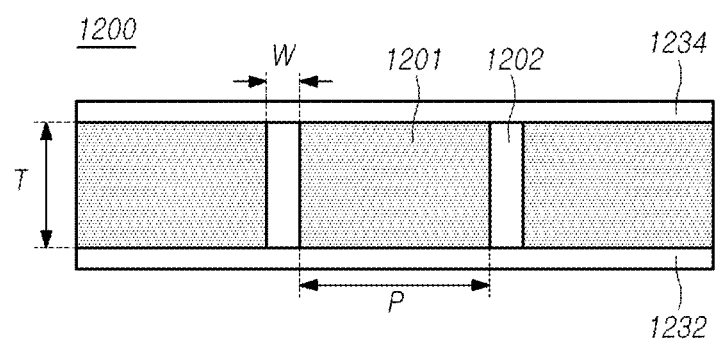
FIG. 19 is a view illustrating a vibration generation device in accordance with another embodiment of the present disclosure.

FIG. 19 illustrates a vibration generation device according to another embodiment of the present disclosure.

With reference to FIG. 19, the vibration generation device 1200 in accordance with another embodiment of the present disclosure may include a first portion 1201 and a second portion 1202. A first electrode 1232 and a second electrode 1234 may be disposed on the lower surface and the upper surface of both the first portion 1201 and the second portion 1202, respectively. Since the first portion 1201, the second portion 1202, the first electrode 1232, and the second electrode 1234 are the same as those described with reference to FIGS. 15 and 16, and will be omitted. The vibration generation device is disposed over the substrate, and the width and length of the substrate are 100 mm and 0.5 mm, respectively. The first portion 1201 is formed of a Lead Zirconate Titanate (PZT; PbZrO$_3$) based ceramic material, and the size (or pitch) and the thickness of the first portion 1201 is 300 μm and 200 μm, respectively. The second portion 1202 is formed of an epoxy resin series, and the width w, which is the size of the second portion 1202, is 50 μm. For example, in order to further improve piezoelectric properties/characteristics, the size of the first portion 1201 is greater than that of the second portion 1202. The result of measuring vibration acceleration is shown in Table 2 below. Vibration acceleration was measured using National Instrument's NIX equipment. The vibration acceleration can be obtained by measuring vibration acceleration output from the vibration generation device after a voltage is applied to the vibration generation device while an acceleration sensor is attached to the vibration generation device; however, embodiments of the present disclosure are not limited thereto.

TABLE 2

| Voltage | 75 Hz | 183 Hz |
| --- | --- | --- |
| 10 V | 3.1 G | 2.1 G |
| 20 V | 6.5 G | 4.9 G |
| 30 V | 10.6 G | 8.3 G |

In Table 2, 75 Hz is a resonant frequency of a glass substrate (100 mm in width and length, respectively), and 183 Hz is a resonant frequency of 12.5 inches in stainless steel. As shown in Table 2, it may be seen that the piezoelectric characteristic is improved when the size of the first portion 1201 is greater than the size of the second portion 1202. For example, when the voltage is 30V, it may be seen that the vibration acceleration is about 10.6 G at 75 Hz, which is the resonance frequency of the glass substrate. For example, when the voltage is 30V, it may be seen that the vibration acceleration is about 8.3 G at 183 Hz, which is the resonance frequency of the stainless steel. For example, as described in Table 2, the vibration acceleration of the piezoelectric ceramic at about 30V or less is about 7 G, and the vibration acceleration of the vibration generation device 1200 according to another embodiment of the present disclosure is about 10.6 at a voltage of 30V. Therefore, it may be seen that the vibration generation device according to another embodiment of the present disclosure exhibits higher piezoelectric characteristics than the piezoelectric ceramic. For example, it may be seen that the vibration generation device according to another embodiment of the present disclosure can be used as a speaker of a display apparatus or a speaker of a vehicle.

Figure 20:
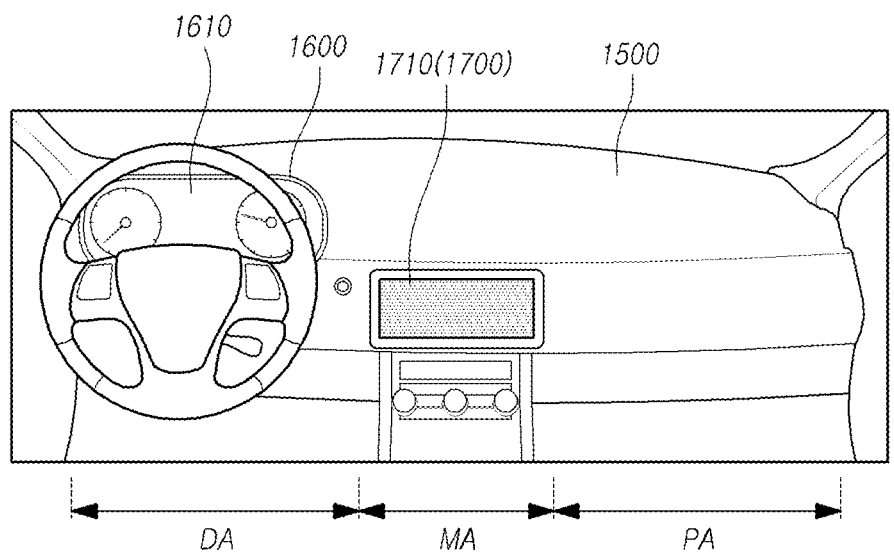
FIG. 20 is a view illustrating a vehicle in accordance with an embodiment of the present disclosure.

FIG. 20 illustrates a vehicle according to another embodiment of the present disclosure. FIG. 20 illustrates an example of a vehicle including at least one of the display apparatuses according to the embodiments illustrated in FIGS. 1 to 16 and 19.

With reference to FIG. 20, a display apparatus 1500 according to an embodiment of the present disclosure may include a dashboard 1500, an instrument panel module 1600, and an infotainment module 1700.

The dashboard board 1500 may include a first region DA facing the driver seat or corresponding to the driver seat, a second region PA facing the passenger seat or corresponding to the passenger seat, and a third region MA between the first region DA and the second region PA.

The instrument panel module 1600 may include a first display 1610 in the first region DA of the dashboard 1500. The first display 1610 may provide a driver with various information such as vehicle status information and driving related information such as a driving time, a velocity, a fuel amount, and revolution per minute (RPM) of the vehicle.

The first display 1610 includes the display apparatus according to the embodiments of the present disclosure illustrated in FIGS. 1 to 16 and 19, and thus, its repetitive description is omitted. The first display 1610 may display an image corresponding to driving information of the vehicle provided from a vehicle host system on the display panel. Also, the first display 1610 may output, to the driver seat, sounds generated by a vibration of the display panel responding to a vibration of the vibration generation device based on a sound driving signal provided from the vehicle host system.

The infotainment module (or an infotainment system) 1700 may include a second display 1710 that is disposed in the third region MA (or a center fascia) of the dashboard 1500.

The second display 1710 may be connected to a navigation system and a vehicle convenience system such as an audio system, an air conditioning system, and a multimedia system each equipped in the vehicle, and may display navigation information provided from the navigation system and a control icon for controlling a corresponding vehicle convenience system. Also, the second display may provide a driver or a passenger with a sound corresponding to a sound signal provided from the audio system and/or the multimedia system.

The second display 1710 includes the display apparatus according to the embodiments of the present disclosure illustrated in FIGS. 1 to 16 and 19, and thus, its repetitive description is omitted. The second display 1710 may display navigation information provided from the navigation system and a control icon for controlling vehicle convenience system. Also, the second display 1710 may directly output a sound generated from the display panel that vibrates by a vibration of the vibration generation device based on a sound signal from the audio system and/or the multimedia system. Also, the second display 1710 may sense a used touch through a touch electrode layer disposed in the display panel to perform an interface with a user.

The second display 1710 may have a length that is enlarged toward the second region PA of the dashboard 1500. For example, the second display 1710 may be disposed across the third region MA and the second region PA of the dashboard 1500.

Accordingly, the vehicle according to embodiments of the present disclosure may include the instrument panel module 1600 including the first display 1610 to which the display apparatus according to embodiments of the present disclosure illustrated in FIGS. 1 to 16 and 19 is applied, and thus, may output sound generated by the vibration of the first display 1610, to the head of a driver. Thus, the sound from the vibration of the first display 1610 may be directly transferred to the driver's ears, thereby, transferring a sound substantially similar to an original sound to the driver. For example, when the vibration generation device according to the embodiment of FIG. 19 is applied to the first display 1610, it is possible to provide a display apparatus that may include a haptic-enabled sound generator and a speaker. Herein, the haptic-enabled sound generator may be a device, unit, component, system, or the like comprise providing haptic effects or haptic feedback, as well as a speaker, or the like.

Accordingly, the vehicle according to embodiments of the present disclosure may include the infotainment module 1700 including the second display 1710 to which the display apparatus according to embodiments of the present disclosure illustrated in FIGS. 1 to 16 and 19 is applied, and thus, may output sound, generated by the vibration of the second display 1710, to ears of the driver and/or a passenger, thereby transferring a sound substantially similar to an original sound to the driver and/or the passenger. Further, when the vibration generation device according to the embodiments of FIGS. 4, 9, 10 and 16 is applied to the second display 1710, it is possible to provide a display apparatus that may include a haptic-enabled sound generator, a speaker, and a reflection preventing function.

Further, the vehicle according to embodiments of the present disclosure may use each of the first display 1610 of the instrument panel module 1600 and the second display 1710 of the infotainment module 1700 as a speaker and/or a haptic-enabled sound generator for sound output, and transmit two-channel based stereoscopic sound to the driver and/or an occupant of the vehicle through sounds generated by the respective vibrations of the first and second displays 1610 and 1710.

Figure 21:
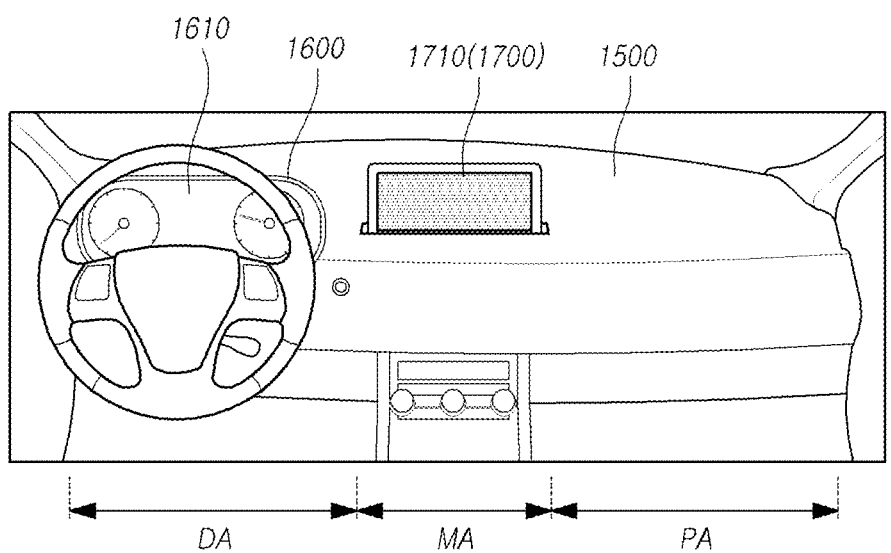
FIG. 21 is a view illustrating a vehicle in accordance with another embodiment of the present disclosure.

FIG. 21 illustrates a vehicle according to another embodiment of the present disclosure, in which a structure of the infotainment module shown in FIG. 20 is changed. Hereinafter, description of the same elements except an infotainment module and relevant elements will be briefly given or omitted.

With reference to FIG. 21, an infotainment module 1700 according to embodiments of the present disclosure may be operably installed in the third region MA of the dashboard 1500 such that the infotainment module 1700 may be installed to be raised and/or lowered from the dashboard 1500. The infotainment module 1700 may be at least partially accommodated or moved into the dashboard 1500 based on the power-off of a vehicle or the operation or manipulation of a passenger and may be at least partially protruded or moved out of the dashboard 1500 based on the power-on of the vehicle or the operation or manipulation of the passenger.

The infotainment module 1700 according to an embodiment of the present disclosure may include a second display 1710 and a display elevation unit.

The second display 1710 is substantially the same as the second display illustrated in FIG. 20, and thus, its repetitive description will be omitted The display elevation unit (or display lifting unit) may be disposed in the third region MA of the dashboard 1500, and may support the second display 1710 so as to be raised or lowered. For example, the display elevation unit may raise the second display 1710 to be lifted/moved or protruded from the dash board 1500, based the power-on of the vehicle or the operation or manipulation of the passenger. Also, the display elevation unit may lower the second display 1710 to accommodate or load the second display 1710 into the dash board 1500, based on the power-off of the vehicle or the operation or manipulation of the passenger. Further, when the vibration generation device according to embodiments of FIGS. 4, 9, 10 and 16 is applied to the second display 1710, it is possible to provide a display apparatus that may include a haptic-enabled sound generator, a speaker (or a sound generation device), and a reflection preventing function. Therefore, the vehicle according to another embodiment of the present disclosure may have the same or similar effect as the vehicle shown in FIG. 20.

Figure 22:
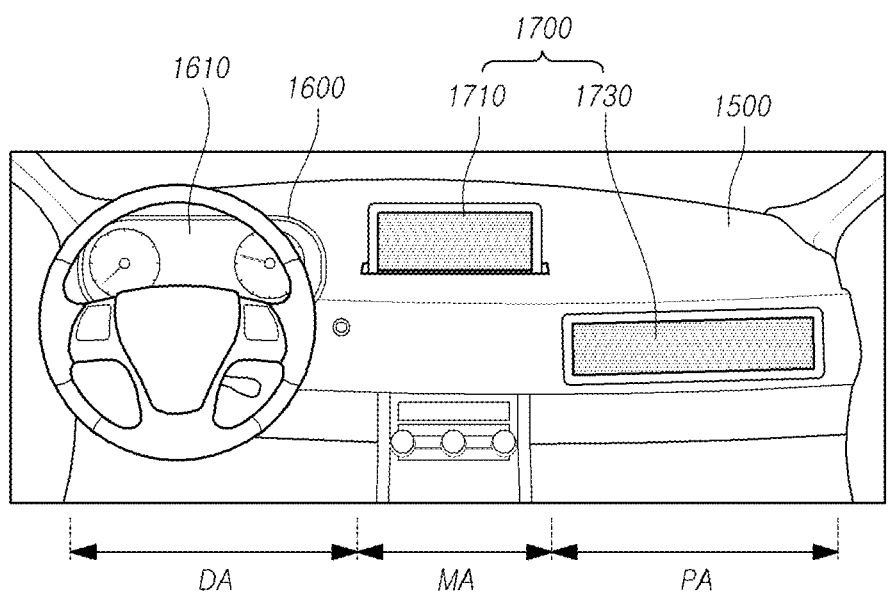
FIG. 22 is a view illustrating a vehicle in accordance with another embodiment of the present disclosure.

FIG. 22 illustrates a vehicle according to another embodiment of the present disclosure, in which the structure of the infotainment module shown in FIG. 21 is changed. Hereinafter, descriptions of the same elements except an infotainment module and relevant elements will be briefly given or omitted.

With reference to FIG. 22, the infotainment module 1700 according to embodiments of the present disclosure may include a second display 1710 that is installed to be raised or lowered in a third region MA of the dashboard 1500, a display elevation unit that raises or lowers the second display 1710, and a third display 1730 that is installed in the second region PA of the dashboard 1500*d*

The second display 1710 and the display elevation unit are substantially to the same as the second display and the display elevation unit each illustrated in FIG. 21, and thus, their repetitive descriptions will be omitted The third display 1730 may share at least one function or configuration of the second display 1710. For example, the third display 1730 may be connected to a navigation system and a vehicle convenience system such as an audio system, an air conditioning system, and a multimedia system each equipped in the vehicle and may display navigation information provided from the navigation system and a control icon for controlling the vehicle convenience system. Also, and the third display 730 may provide a passenger with a sound corresponding to a sound signal provided from the audio system and/or the multimedia system. Also, the third display 1730 may transmit or receive image information or sound information through wireless communication with a wireless communication device of a passenger sitting on a passenger seat and may display the received image information on a display panel.

The third display 1730 includes the display apparatus according to embodiments of the present disclosure illustrated in FIGS. 1 to 16 and 19, and thus, repetitive descriptions will be omitted. Further, when the vibration generation device according to the embodiments of FIGS. 4, 9, 10 and 16 is applied to the third display 1730, it is possible to provide a display apparatus that can include a haptic-enabled sound generator, a speaker, and a reflection preventing function. As another example, when the vibration generation device according to an embodiment of FIG. 19 is applied to the third display 1730, it is possible to provide a display apparatus that can include a haptic-enabled sound generator and a speaker.

The third display 1730 may have a length that is enlarged toward the third region MA of the dashboard 1500. For example, the third display 1730 may be disposed across the second region PA and the third region MA of the dashboard 1500.

Each of the first display 1610 of the instrument panel module 1600 and the second and third displays 1710 and 1730 of the infotainment module 1700 may be used as a speaker (or a sound generating device) or a haptic-enabled sound generator (or a haptic device) for sound output and/or haptic vibration in the vehicle.

Accordingly, the vehicle according to another embodiment of the present disclosure may have the same or similar functions or effects the vehicle illustrated in FIG. 20, use each of the first display 1610 of the instrument panel module 1600 and the second and third displays 1710 and 1730 of the infotainment module 1700 as a speaker for sound output, and transmit three-channel based stereoscopic sound to the driver and/or an occupant of the vehicle through sounds generated by the respective vibrations of the first, second, and third displays 1610, 1710 and 1730. For example, when the vibration generation device according to the embodiments of FIGS. 4, 9, 10 and 16 is applied to the second and third displays 1710 and 1730, it is possible to provide a display apparatus that can include a haptic-enabled sound generator (a haptic device), a sound generation device, and a reflection preventing function.

Figure 23:
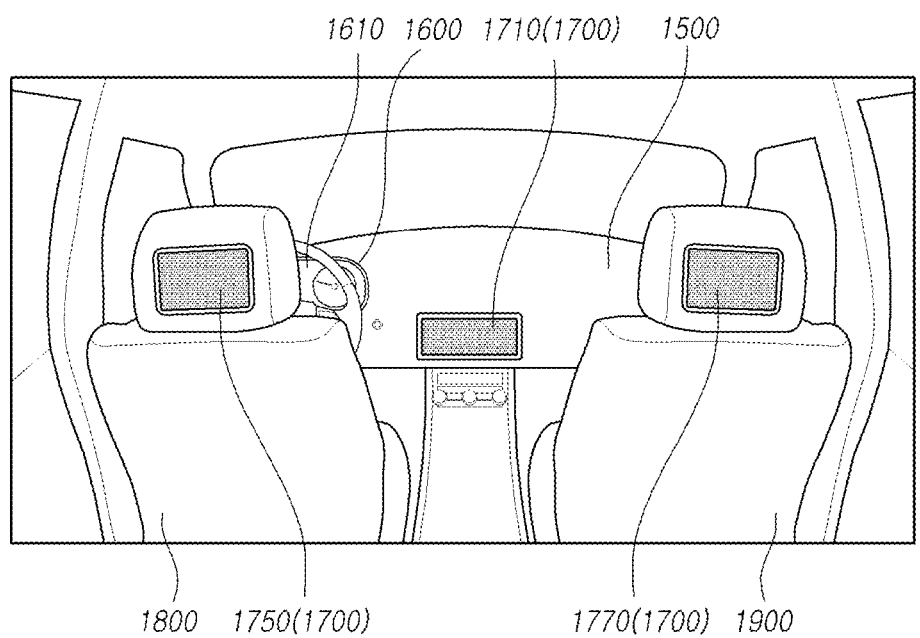
FIG. 23 is a view illustrating a vehicle in accordance with another embodiment of the present disclosure.

FIG. 23 illustrates a vehicle according to another embodiment of the present disclosure, in which the structure of the infotainment module shown in FIG. 20 is changed. Hereinafter, descriptions of the same elements except an infotainment module and relevant elements will be briefly given or omitted.

With reference to FIG. 23, an infotainment module 1700 according to embodiments of the present disclosure may include a fourth display 1750 disposed on a rear surface of a driver seat (or the back of driver seat or driver seat sheet) 1800, and a fifth display 1770 disposed on a rear surface of a passenger seat (or the back of a passenger seat or a passenger set sheet) 1900.

The fourth display 1750 may be disposed or embedded in the headrest of the driver seat 1800, and the fifth display 1770 may be disposed or embedded in the headrest of the passenger seat 1900.

Each of the fourth and fifth displays 1750 and 1770 includes the display apparatus according to the embodiments of the present disclosure illustrated in FIGS. 1 to 16 and 19, and thus, their repetitive descriptions will be omitted.

Each of the fourth and fifth displays 1750 and 1770 may share at least one function or configuration of the second display 1710. Further, the each of the fourth and fifth displays 1750 and 1770 may transmit and receive image information or sound information through wireless communication with a wireless communication device of a passenger sitting on a backseat and may display the received image information on a display panel.

Each of the first display 1610 of the instrument panel module 1600 and the second, fourth and fifth displays 1710, 1750 and 1770 of the infotainment module 1700 may be used as a speaker (or a sound generating device) or a haptic-enabled sound generator (or a haptic device) for sound output and/or haptic vibration in the vehicle.

Accordingly, the vehicle according to another embodiment of the present disclosure may have the same or similar functions or effects the vehicle illustrated in FIG. 20, use each of the first display 1610 of the instrument panel module 1600 and the second, fourth and fifth displays 1710, 1750 and 1770 of the infotainment module 1700 as a speaker (or a sound generating device) and/or haptic-enabled sound generator (pr a haptic device) for sound output and/or haptic vibration, and transmit four-channel based stereoscopic sound to the driver and/or occupants of the vehicle through sounds generated by the respective vibrations of the first, second, fourth and fifth displays 1610, 1710, 1750 and 1770.

As another example, in the vehicle according to another embodiment of the present disclosure, the second display 1710 of the infotainment module 1700 may be installed in the third region MA of the dashboard 1500 so as to be raised or lowered, as shown in FIG. 21. Also, the infotainment module 1700 may further include the third display 1730 illustrated in FIG. 22. In this case, at least one of the first display 1610 of the instrument panel module 1600 and the second to fifth displays 1710, 1730, 1750, and 1770 of the infotainment module 1700 may be used for sound output and/or haptic vibration as a speaker (or a sound generating device) and/or haptic-enabled sound generator (pr a haptic device) for sound output and/or haptic vibration, and sounds generated by the vibration of a display panel included in at least one of the first to fifth displays 1610, 1710, 1730, 1750, and 1770 can be transmitted the driver and/or occupants of the vehicle. For example, when the vibration generation device according to the embodiments of FIGS. 4, 9, 10 and 16 is applied to the second and third displays 1710 and 1730, it is possible to provide a display apparatus that can include a haptic-enabled vibration generator (a haptic device), a speaker, and a reflection preventing function. For example, when the vibration generation device according to the embodiment of FIG. 19 is applied to the first, fourth, and fifth displays 1610, 1750, and 1770, it is possible to provide a display device that can include a haptic-enabled vibration generator and a speaker.

Figure 24:
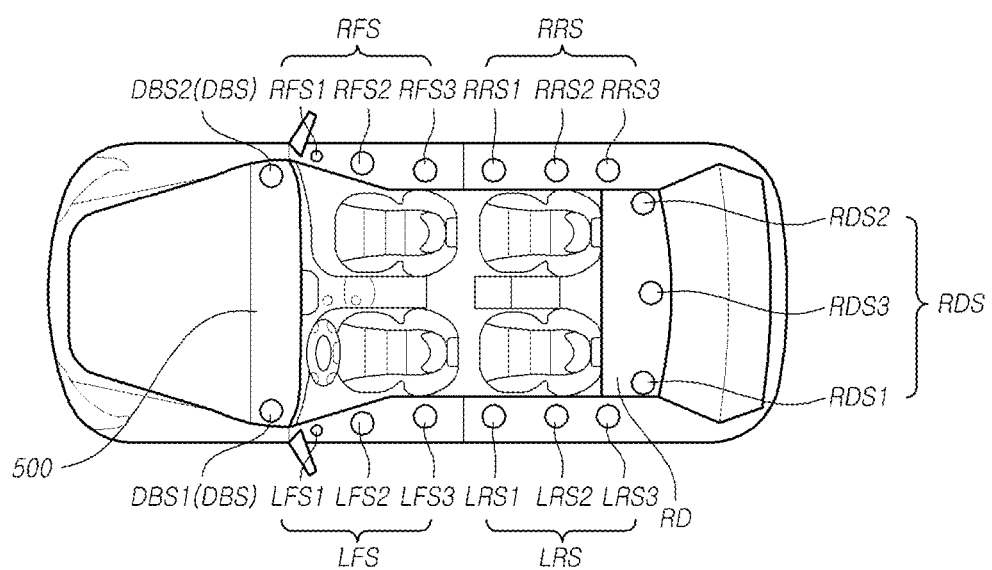
FIG. 24 is a view illustrating a vehicle in accordance with another embodiment of the present disclosure.

FIG. 24 illustrates a vehicle according to another embodiment of the present disclosure, in which a speaker is further located inside the vehicle illustrated in any one of FIGS. 20 to 23. Hereinafter, descriptions of the same elements except an infotainment module and relevant elements will be briefly given or omitted.

Because reverberation is severe in a vehicle and there are many curves with which sound waves collide, there is a problem where it may be difficult to output a desired sound. Accordingly, when the display apparatus according to the embodiments of the present disclosure is provided in a vehicle or in a body of a vehicle, such a vehicle including the display apparatus may have advantages of enabling a small size of speaker to be implemented and having improved sound performance.

With reference to FIG. 24, a vehicle according to another embodiments of the present disclosure may further include at least one of a dash board speaker (DBS), a left front door speaker (LFS), a right front door speaker (RFS), a left rear door speaker (LRS), a right rear door speaker RRS and a rear decor speaker RDS.

The dash board speaker DBS may include at least one of a first dash board speaker DBS1 disposed at a left edge or periphery of the dashboard 1500 and a second dash board speaker DBS2 disposed at a right edge or periphery of the dash board speaker 1500. For example, each of the first and second dash board speakers DBS1 and DBS2 may be a speaker that outputs a sound of 20 kHz to 150 Hz having a mid-range or full-range.

The left front door speaker LFS may include at least one of first, second, and third left front speakers LFS1, LFS2, and LFS3.

The first left front speaker LFS1 may be disposed at a first portion of the left front door adjacent to the dashboard 1500. The second left front speaker LFS2 may be disposed at a middle portion of the left front door. The third left front speaker LFS3 may be disposed at a second portion of the left front door adjacent to the left rear door. For example, the first left front speaker LFS1 may be a speaker of the display panel implemented with the display apparatus illustrated in FIGS. 1 to 16 and 19. In this case, the left front speaker may output sound based on a vibration of the display panel, and may serve as a left side mirror that displays an image from a left rear camera disposed on a left side of the vehicle.

The right front door speaker RFS may include at least one of first, second, and third right front speakers RFS1, RFS2, and RFS3.

The first right front speaker RFS1 may be disposed at a first portion of the right front door adjacent to the dashboard 1500. The second right front speaker RFS2 may be disposed at a middle portion of the right front door. The third right front speaker RFS3 may be disposed at a second portion of the right front door adjacent to the right rear door. For example, the first right front speaker RFS1 may be a speaker of the display panel implemented with the display apparatus illustrated in FIGS. 1 to 16 and 19. In this case, the right front speaker may output sound based on a vibration of the display panel, and may serve as a right side mirror that displays an image from a right rear camera disposed on a right side of the vehicle.

For example, each of the first left front speaker LFS1 and the first right front speaker RFS1 may be a speaker that outputs a sound of 20 kHz at 150 Hz having a mid-range or a full-range. The sound output from the first left front speaker LFS1 and the first right front speaker RFS1 may be combined and output.

Each of the second left front speaker LFS2 and the second right front speaker RFS2 may be a tweeter, or may be a speaker that outputs a sound of 2 kHz at 20 Hz. The sound output from the first and second left front speakers LFS1, LFS2 and the first and second right front speakers RFS1, RFS2 may be combined and output.

Each of the third left front speaker LFS3 and the third right front speaker RFS3 may be one of a woofer, a mid-woofer, and a sub-woofer, or be a speaker that outputs a sound of 20 kHz to 150 Hz having a mid-range or full-range. The sound output from the third left front speaker LFS3 and the third right front speaker RFS3 may be combined and output.

The left rear door speaker LFS may include at least one of first, second, and third left rear speakers LRS1, LRS2, and LRS3.

The first left rear speaker LRS1 may be disposed at a first portion of the left rear door adjacent to the left front door. The second left rear speaker LRS2 may be disposed at a middle portion of the left rear door. The third left rear speaker LRS3 may be disposed at a second portion of the left rear door adjacent to the rear decor RD.

The right rear door speaker RFS may include at least one of first, second, and third right rear speakers RRS1, RRS2, and RRS3.

The first left rear speaker RRS1 may be disposed at a first portion of the right rear door adjacent to the right front door. The second right rear speaker RRS2 may be disposed at a middle portion of the right rear door. The third right rear speaker RRS3 may be disposed at a second portion of the right rear door adjacent to the rear decor RD.

Each of the first left rear speaker LRS1 and the first right rear speaker RRS1 may be a tweeter, or may be a speaker that outputs a sound of 2 kHz at 20 Hz. The sound output from the first left rear speaker LRS1 and the first right rear speaker RRS1 may be combined and output.

For example, each of the second left rear speaker LRS2 and the second right rear speaker RRS2 may be a speaker that outputs a sound of 20 kHz at 150 Hz having a mid-range or a full-range. The sound output from each of the first and second left rear speakers LRS1, LRS2 and the first and second right rear speakers RRS1, RRS2 may be combined and output.

Each of the third left rear speaker LRS3 and the third right rear speaker RRS3 may be one of a woofer, a mid-woofer, and a sub-woofer, or be a speaker outputting a sound of 20 kHz to 150 Hz having a mid-range or full-range. The sound output from the third left rear speaker LRS3 and the third right rear speaker RRS3 may be combined and output.

The rear deco speaker RDS includes at least one of a first rear deco speaker RDS1 disposed at a left edge or periphery of the rear deco RD, a second rear deco speaker RDS2 disposed at a right edge or periphery of the rear deco RD, and a third rear deco speaker RDS3 disposed at the middle of the rear deco.

Each of the first rear deco speaker RDS1 and the second rear deco speaker RDS2 may be a speaker that outputs a sound of 150 Hz to 20 kHz having a mid-range or full-range.

The third rear deco speaker RDS3 is one of a woofer, a mid-woofer, and a sub-woofer, a speaker outputting sound of 60 Hz to 150 Hz, at least one tweeter, or may be a speaker that outputs a sound of 2 kHz to 20 kHz.

Based on the direction of looking at the windshield of the vehicle, the speakers disposed on the left and right sides may be symmetrically configured. For example, the frequency of sound output from a speaker disposed on the left side of the inside of the vehicle may be one or more of 150 Hz to 20 kHz and 2 kHz to 20 kHz, and the frequency output from a vibration generation device disposed on the right side of the inside of the vehicle may be one or more of 150 Hz to 20 kHz and 2 kHz to 20 kHz. When the speaker is disposed as described above, the sound image stereotacticity output from the left and right sides of the inside of the vehicle may be improved.

Accordingly, the vehicle according to another embodiment of the present disclosure may use at least one of the first display 1610 of the instrument panel module 1600 and the second, third, fourth and fifth displays 1710, 1730, 1750 and 1770 of the infotainment module 1700 as a speaker (or a sound generating device) for sound output, and can provide multichannel surround stereo sound to the driver and/or a vehicle occupant by outputting sound through at least one speaker disposed in at least one of the dashboard 1500, rear decor RD, and left and right doors, as well as outputting sound generated by the vibration of the display panel included in at least one of the first, second, third, fourth and fifth displays 1610, 1710, 1730, 1750 and 1770.

The vibration generation device according to the embodiments of the present disclosure may be applied for a vibration generation device disposed in a display apparatus. The display apparatus according to the embodiments of the present disclosure may be or may be applied to a mobile apparatus, a video phone, a smart watch, a watch phone, a wearable apparatus, a foldable apparatus, a rollable apparatus, a bendable apparatus, a flexible apparatus, a curved apparatus, an electronic diary, an e-book, a portable multimedia player (PMP), a personal digital assistant (PDA), a MP3 player, a mobile medical apparatus, a desktop personal computer (PC), a laptop PC, a netbook computer, a workstation, a navigation, a car navigation, an automotive display apparatus, an automotive navigation apparatus, a theater device/apparatus, a television, a wallpaper display apparatus, a signage apparatus, a game machines, a notebook computer, a monitor, a camera, a camcorder, and home appliances. Further, the vibration generation device herein may be applied to an organic light emitting lighting apparatus or an inorganic light emitting lighting apparatus. When the vibration generation device is applied to the lighting apparatus, it can serve as a lighting and speaker.

A vibration generation device according to embodiments of the present disclosure, a display apparatus and a vehicle which include the vibration generation device may be described as follows.

A vibration generation device according to an embodiment of the present disclosure may include: a piezoelectric ceramic part having a certain interval, a piezoelectric material layer between the piezoelectric ceramic parts, and an electrode part configured to provide an electric field to at least one or more of the piezoelectric ceramic part and the piezoelectric material layer.

In accordance with some embodiments of the present disclosure, the piezoelectric ceramic part may include a plurality of piezoelectric ceramic parts spaced apart from one another having a pitch, and having a first width and a first thickness and disposed in a first direction, the electrode part may include a first electrode on a first surface of each of the piezoelectric ceramic parts and a second electrode on a second surface of each of the piezoelectric ceramic parts.

In accordance with some embodiments of the present disclosure, the first electrode and the second electrode are formed of one of copper (Cu), aluminum (Al), nickel (Ni), chromium (Cr), nickel-phosphorus (Ni—P), tungsten (W), platinum (Pt) and silver (Ag), or an alloy material thereof.

In accordance with some embodiments of the present disclosure, the electrode part may further include a third electrode electrically connected to the second electrode and disposed on the entire surface of one side or an entire of the one side surface, of at least one of the piezoelectric ceramic parts and the piezoelectric material layer.

In accordance with some embodiments of the present disclosure, the first electrode may be disposed on a first side surface and an upper surface of each of the piezoelectric ceramic parts, and the second electrode may be disposed on a second side surface of each of the piezoelectric ceramic parts.

In accordance with some embodiments of the present disclosure, a pitch P of the piezoelectric ceramic parts is larger than a first width of each of the piezoelectric ceramic parts and is smaller than the first thickness of each of the piezoelectric ceramic parts.

In accordance with some embodiments of the present disclosure, the first width of the piezoelectric ceramic part may be 30 μm or less, the pitch P may be not less than two times and not more than 5 times of the first width, and the first thickness may be not less than two times and not more than 4 times of the pitch.

In accordance with some embodiments of the present disclosure, the vibration generation device may further include a protective layer on at least one of the entire upper surface and the entire lower surface of both the piezoelectric ceramic part and the piezoelectric material layer.

In accordance with some embodiments of the present disclosure, the piezoelectric ceramic part may include a plurality of piezoelectric ceramic lattices each with a certain width, the piezoelectric material layer is between the piezoelectric ceramic lattices, such as inside each lattice, and the electrode part includes a first electrode and a second electrode on an upper surface and a lower surface of both the piezoelectric ceramic part and the piezoelectric material layer, respectively.

In accordance with some embodiments of the present disclosure, the piezoelectric ceramic part may include a plurality of piezoelectric ceramic parts spaced apart from one another having a pitch, disposed to be spaced apart from one another, having a first width and a first thickness, and disposed in a first direction, and the electrode part may include a first electrode and a second electrode on an upper surface and a lower surface of both the piezoelectric ceramic part and the piezoelectric material layer, respectively.

In accordance with some embodiments of the present disclosure, the pitch is larger or equal to two times of the first width and less or equal to five times of the first width.

In accordance with some embodiments of the present disclosure, In accordance with some embodiments of the present disclosure, the pitch is larger or equal to two times of the first width and less or equal to five times of the first width.

In accordance with some embodiments of the present disclosure, the first thickness is larger or equal to two times of the pitch and less or equal to five times of the pitch.

In accordance with some embodiments of the present disclosure, the piezoelectric ceramic part may have a piezoelectric characteristic and may be one of an opaque piezoelectric ceramic material and a piezoelectric ceramic fiber.

In accordance with some embodiments of the present disclosure, the piezoelectric material layer may include at least one of polyvinylidene fluoride (PVDF), polyvinylidene fluoride-co-trifluoroethylene (P(VDF-TrFE)), relaxor ferroelectric polymer, PVDF polymer doped with P(VDF-TrFe-CFE), P(VDF-TrFE-CTFE), CNT and the like, and poly bis (trifluoroethoxy) phosphazene.

According to some embodiments of the present disclosure, the vibration generation apparatus may further include a driver. The driver may be configured to receive a touch signal from the touch driver, and apply a power to the electrode part of the vibration generation device when the tooth signal is received.

In accordance with some embodiments of the present disclosure, the piezoelectric ceramic part is formed of a polycrystalline PZT-based ceramic material, a polycrystalline PT-based ceramic material, a PZT-complex perovskite material, or $BaTiO_3$.

According to some embodiments of the present disclosure, a display apparatus may include a liquid crystal display panel including a thin film transistor substrate, a backlight configured to provide backlight to the liquid crystal display panel, and a vibration generation device disposed at least one or more of between the backlight and the liquid crystal display panel, on an upper surface of the liquid crystal display panel, and on a lower surface of the liquid crystal display panel, the vibration generation device includes a piezoelectric ceramic part arranged having an interval, a piezoelectric material layer between at least two piezoelectric ceramic parts, and an electrode part configured to an electric field to at least one or more of the piezoelectric ceramic part and the piezoelectric material layer.

According to some embodiments of the present disclosure, the display apparatus may further include a touch driver configured to sense a touch input, and a driver configured to control a driving of the vibration generation device, wherein the driver is configured to receive a touch input signal for the touch input inputted to a liquid crystal display panel from the touch driver, and apply a power to the electrode part of the vibration generation device when the touch input signal is received.

According to some embodiments of the present disclosure, the display apparatus may further include a supporting member that supports the display apparatus, and a panel guide that supports a rear periphery portion of the display panel and is supported by or accommodated into the supporting member. According to some embodiments of the present disclosure, the display apparatus may include: an organic light emitting display panel including a thin film transistor substrate, and a vibration generation device in the organic light emitting display panel, the vibration generation device includes a piezoelectric ceramic part arranged having an interval, a piezoelectric material layer between at least two piezoelectric ceramic parts, and an electrode part configured to provide an electric field to at least one or more of the piezoelectric ceramic part and the piezoelectric material layer.

According to some embodiments of the present disclosure, the display apparatus may further include a touch driver configured to sense a touch input, and a driver configured to a driving of the vibration generation device, wherein the driver is configured to receive a touch input signal for the touch input inputted to an organic light emitting display panel from the touch driver, and apply a power to the electrode part of the vibration generation device when the touch input signal is received.

According to some embodiments of the present disclosure, the display apparatus including: a display panel configured to display an image, and a vibration generation device in the display panel, the vibration generation device including a plurality of first portions having piezoelectric characteristics, a plurality of second portions between the plurality of first portions, and at least one electrode over the plurality of first portions and the plurality of second portions.

According to some embodiments of the present disclosure, the first portion may be formed of an inorganic material and the second portion may be formed of an organic material.

According to some embodiments of the present disclosure, the plurality of first portions and the plurality of second portions may be in parallel with each other in the same plane, and the sizes of the plurality of first portions and the sizes of the plurality of second portions may be different from each other.

According to some embodiments of the present disclosure, the vibration generation device having a size of the plurality of first portions greater than that of the plurality of second portions may be configured to be a sound generation device or a haptic-enabled sound generator, or a haptic device.

According to some embodiments of the present disclosure, the vibration generation device having a size of the plurality of first portions smaller than that of the plurality of second portions may be configured to be a light control device of the display panel.

According to some embodiments of the present disclosure, the display apparatus may further include a backlight configured to provide a light source to the display panel, and the vibration generation device may be disposed in at least one or more of between the backlight and on a lower surface of the display panel.

According to some embodiments of the present disclosure, the display apparatus may further include a touch driver configured to sense a touch input, and a driver configured to control a driving of the vibration generation device, wherein the driver is configured to receive a touch input signal for the touch input inputted to the display panel from the touch driver, and apply a power to the at least one electrode when the touch input signal is received.

According to some embodiments of the present disclosure, the touch device may further include a touch sensor over an upper surface of the display panel, and a front member over the touch sensor, and the vibration generation device may be between the display panel and the touch sensor.

According to some embodiments of the present disclosure, the display apparatus may further include a polarizing member between the vibration generation device and the display panel.

According to some embodiments of the present disclosure, the display apparatus may further include a polarizing member on an upper surface of the touch sensor.

According to some embodiments of the present disclosure, the at least one electrode may include a first electrode on a lower surface of the vibration generation device, and a second electrode on an upper surface of the vibration generation device.

According to some embodiments of the present disclosure, the at least one electrode may include a first electrode on a lower surface of the vibration generation device, a third electrode on a first surface of the first portion, and a fourth electrode on a second surface of the first portion and connected to the first electrode.

According to some embodiments of the present disclosure, the display panel may include a pixel array substrate and a second substrate over the pixel array substrate, and the vibration generation device may be in the second substrate.

According to some embodiments of the present disclosure, the at least one electrode may include a first electrode on a lower surface of the vibration generation device, and a second electrode on an upper surface of the vibration generation device.

According to some embodiments of the present disclosure, at least one of the plurality of first portions is disposed to extend in a first direction having a first size, and the at least one electrode includes a first electrode on a lower surface of the vibration generation device, and a second electrode on an upper surface of the vibration generation device.

According to some embodiments of the present disclosure, a vehicle including: a dashboard including a first region facing a driver seat, a second region facing a passenger seat, and a third region between the first region and the second region, an instrument panel module including a first display in the first region of the dashboard, an infotainment module including at least one of a second display in the third region of the dashboard, a third display in the second region of the dashboard, a fourth display on a rear surface of the driver seat, and a fifth display on a rear surface of the passenger seat, the at least one of the first to fifth displays includes a display apparatus including a vibration generation device, the vibration generation device includes a plurality of first portions having piezoelectric characteristics, a plurality of second portions between the plurality of first portions, and an electrode over at least one of the plurality of first portions and the plurality of second portions.

According to some embodiments of the present disclosure, the vibration generation device having a size of the plurality of first portions smaller than that of the plurality of second portions may be in one of the second display and the third display.

According to some embodiments of the present disclosure, the vibration generation device having a size of the plurality of first portions larger than that of the plurality of second portions may be disposed in one of the first, fourth, and fifth displays.

According to some embodiments of the present disclosure, the vehicle or the display apparatus further includes a left front door, a right front door, a left rear door, a right rear door, and a rear decor, and may further include at least one or more of at least one dashboard speaker on a dashboard, at least one left front door speaker at the left front door, at least one right front door speaker at the right front door, at least one left rear door speaker at the left rear door, at least one right rear door speaker at the right rear door, and at least one rear deco speaker in the rear deco.

According to some embodiments of the present disclosure, at least one speaker may include the display apparatus having the vibration generation device. It will be apparent to those skilled in the art that various modifications and variations may be made in the present disclosure without departing from the technical idea or scope of the disclosures. Thus, it may be intended that embodiments of the present disclosure cover the modifications and variations of the disclosure provided they come within the scope of the appended claims and their equivalents.

What is claimed is:

1. A vibration generation device, comprising:
   a piezoelectric ceramic part having a certain interval;
   a piezoelectric material layer between at least two piezoelectric ceramic parts; and
   an electrode part configured to provide an electric field to one or more of the piezoelectric ceramic part and the piezoelectric material layer,
   wherein among the upper and lower surfaces of the piezoelectric ceramic part, the upper surface of the piezoelectric ceramic part is located in the direction in which light is introduced, and has a narrower width than the lower surface of the piezoelectric ceramic part, and
   wherein among the upper and lower surfaces of the piezoelectric material layer, the upper surface of the piezoelectric material layer is located in a direction in which the light is introduced, and has a wider width than the lower surface of the piezoelectric material layer.

2. The vibration generation device according to claim 1, wherein the piezoelectric ceramic part includes a plurality of piezoelectric ceramic parts spaced apart from one another having a pitch, and having a first width and a first thickness and disposed in a first direction,
   wherein the electrode part includes a first electrode on a first surface of each of the plurality of piezoelectric ceramic parts and a second electrode on a second surface of each of the plurality of piezoelectric ceramic parts.

3. The vibration generation device according to claim 2, wherein the first electrode and the second electrode are formed of one of copper (Cu), aluminum (Al), nickel (Ni), chromium (Cr), nickel-phosphorus (Ni-P), tungsten (W), platinum (Pt) and silver (Ag), or an alloy material thereof.

4. The vibration generation device according to claim 2, wherein the electrode part further includes a third electrode electrically connected to the second electrode and disposed on an entire surface of one side, or an entire of one side surface, of at least one of the piezoelectric ceramic part and the piezoelectric material layer.

5. The vibration generation device according to claim 2, wherein the first electrode is disposed on a first side surface and an upper surface of each of the piezoelectric ceramic parts, and the second electrode is disposed on a second side surface of each of the piezoelectric ceramic parts.

6. The vibration generation device according to claim 2, wherein the pitch of the plurality of piezoelectric ceramic parts is larger than the first width of each of the piezoelectric ceramic parts and is smaller than the first thickness of each of the piezoelectric ceramic parts.

7. The vibration generation device according to claim 6, wherein the first width of the piezoelectric ceramic part is 30

µm or less, the pitch is not less than two times and not more than five times of the first width, and the first thickness is not less than two times and not more than four times of the pitch.

8. The vibration generation device according to claim 1, further comprising: a protective layer on at least one of an entire upper surface and an entire lower surface of both the piezoelectric ceramic part and the piezoelectric material layer.

9. The vibration generation device according to claim 1, wherein:
the piezoelectric ceramic part includes a plurality of piezoelectric ceramic lattices each with a certain width,
the piezoelectric material layer is between the piezoelectric ceramic lattices, and
the electrode part includes a first electrode and a second electrode on an upper surface and a lower surface of both the piezoelectric ceramic part and the piezoelectric material layer, respectively.

10. The vibration generation device according to claim 1, wherein:
the piezoelectric ceramic part includes a plurality of piezoelectric ceramic parts having a pitch, disposed to be spaced apart from one another, having a first width and a first thickness, and disposed in a first direction, and
the electrode part includes a first electrode and a second electrode on an upper surface and a lower surface of both the piezoelectric ceramic part and the piezoelectric material layer, respectively.

11. The vibration generation device according to claim 10, wherein the pitch is greater than the first width and the first thickness is greater than the pitch.

12. The vibration generation device according to claim 11, wherein the pitch is larger or equal to two times of the first width and less or equal to five times of the first width.

13. The vibration generation device according to claim 11, wherein the first thickness is larger or equal to two times of the pitch and less or equal to five times of the pitch.

14. The vibration generation device according to claim 1, wherein the piezoelectric ceramic part has piezoelectric characteristics and is formed of one of an opaque piezoelectric ceramic material and a piezoelectric ceramic fiber.

15. The vibration generation device according to claim 1, wherein the piezoelectric material layer includes at least one of polyvinylidene fluoride (PVDF), polyvinylidene fluoride-co-trifluoroethylene (P(VDF-TrFE)), relaxor ferroelectric polymer, PVDF polymer doped with P(VDF-TrFe-CFE), P(VDF-TrFE-CTFE), CNT, and poly bis (trifluoroethoxy) phosphazene.

16. The vibration generation device according to claim 1, further comprising a driver,
wherein the driver is configured to receive a touch signal from a touch driver, and apply a power to the electrode part of the vibration generation device when the touch signal is received.

17. The vibration generation device according to claim 1, wherein the piezoelectric ceramic part is formed of a polycrystalline PZT-based ceramic material, a polycrystalline PT-based ceramic material, a PZT-complex perovskite material, or BaTiO$_3$.

18. A display apparatus, comprising:
a liquid crystal display panel including a thin film transistor substrate;
a backlight configured to provide a light source to the liquid crystal display panel; and
a vibration generation device disposed in at least one or more of between the backlight and the liquid crystal display panel, on an upper surface of the liquid crystal display panel, and on a lower surface of the liquid crystal display panel,
wherein the vibration generation device includes:
a piezoelectric ceramic part arranged having an interval;
a piezoelectric material layer between at least two piezoelectric ceramic parts; and
an electrode part configured to provide an electric field to at least one or more of the piezoelectric ceramic part and the piezoelectric material layer,
wherein among the upper and lower surfaces of the piezoelectric ceramic part, the upper surface of the piezoelectric ceramic part is located in the direction in which light is introduced, and has a narrower width than the lower surface of the piezoelectric ceramic part, and
wherein among the upper and lower surfaces of the piezoelectric material layer, the upper surface of the piezoelectric material layer is located in a direction in which the light is introduced, and has a wider width than the lower surface of the piezoelectric material layer.

19. The display apparatus according to claim 18, further comprising:
a touch driver configured to sense a touch input; and
a driver configured to control the driving of the vibration generation device,
wherein the driver is configured to receive a touch input signal for the touch input inputted to the liquid crystal display panel from the touch driver, and apply a power to the electrode part of the vibration generation device when the touch input signal is received.

20. The display apparatus according to claim 18, further comprising:
a supporting member that supports the display apparatus; and
a panel guide that supports a rear periphery portion of the display panel and is supported by or accommodated into the supporting member.

21. A display apparatus, comprising:
an organic light emitting display panel including a thin film transistor substrate; and
a vibration generation device in the organic light emitting display panel,
wherein the vibration generation device includes:
a piezoelectric ceramic part arranged having an interval;
a piezoelectric material layer between at least two piezoelectric ceramic parts, and an electrode part configured to provide an electric field to at least one or more of the piezoelectric ceramic part and the piezoelectric material layer,
wherein among the upper and lower surfaces of the piezoelectric ceramic part, the upper surface of the piezoelectric ceramic part is located in the direction in which light is introduced, and has a narrower width than the lower surface of the piezoelectric ceramic part, and
wherein among the upper and lower surfaces of the piezoelectric material layer, the upper surface of the piezoelectric material layer is located in a direction in which the light is introduced, and has a wider width than the lower surface of the piezoelectric material layer.

22. The display apparatus according to claim 21, further comprising:
a touch driver configured to sense a touch input; and a driver configured to control a driving of the vibration generation device,
wherein the driver is configured to receive a touch input signal for the touch input inputted to the organic light emitting display panel from the touch driver, and apply a power to the electrode part of the vibration generation device when the touch input signal is received.

23. A display apparatus, comprising:
a display panel configured to display an image: and
a vibration generation device in the display panel,
wherein the vibration generation device comprising:
a plurality of first portions having piezoelectric characteristics;
a plurality of second portions between the plurality of first portions; and
at least one electrode over the plurality of first portions and the plurality of second portions,
wherein the piezoelectric ceramic part includes a plurality of piezoelectric ceramic parts having a pitch, disposed to be spaced apart from one another, having a first width and a first thickness, and disposed in a first direction, and
the electrode part includes a first electrode and a second electrode on an upper surface and a lower surface of both the piezoelectric ceramic part and the piezoelectric material layer, respectively,
wherein the pitch is greater than the first width and the first thickness is greater than the pitch, and
wherein the pitch is larger or equal to two times of the first width and less or equal to five times of the first width.

24. The display apparatus according to claim 23, wherein the plurality of first portions is formed of an inorganic material, and the plurality of second portions is formed of an organic material.

25. The display apparatus according to claim 23, wherein the plurality of first portions and the plurality of second portions are in parallel with each other in the same plane, and sizes of the plurality of first portions and sizes of the plurality of second portions are different from each other.

26. The display apparatus according to claim 25, wherein the vibration generation device having a size of the plurality of first portions greater than that of the plurality of second portions is configured to be a sound generation device, a haptic-enabled sound generator, or a haptic device.

27. The display apparatus according to claim 25, wherein the vibration generation device having a size of the plurality of first portions smaller than that of the plurality of second portions is configured to be a light control device.

28. The display apparatus according to claim 23, further comprising: a backlight configured to provide a light source to the display panel,
wherein the vibration generation device is disposed in at least one or more of: between the backlight and the display panel and on a lower surface of the display panel.

29. The display apparatus according to claim 28, further comprising:
a touch driver configured to sense a touch input; and
a driver configured to control a driving of the vibration generation device,
wherein the driver is configured to receive a touch input signal for the touch input inputted to the display panel from the touch driver, and apply a power to the at least one electrode part when the touch input signal is received.

30. The display apparatus according to claim 23, further comprising:
a touch sensor over an upper surface of the display panel; and
a front member over the touch sensor,
wherein the vibration generation device is between the display panel and the touch sensor.

31. The display apparatus according to claim 30, further comprising: a polarizing member between the vibration generation device and the display panel.

32. The display apparatus according to claim 30, further comprising: a polarizing member on an upper surface of the touch sensor.

33. The display apparatus according to claim 23, wherein the at least one electrode includes a first electrode on a lower surface of the vibration generation device, and a second electrode on an upper surface of the vibration generation device.

34. The display apparatus according to claim 33, wherein the at least one electrode includes a first electrode on a lower surface of the vibration generation device, a third electrode on a first surface of at least one of the plurality of first portions, and a fourth electrode on a second surface of at least one of the plurality of first portions and connected to the first electrode.

35. The display apparatus according to claim 33, wherein the display panel includes a pixel array substrate and a second substrate over the pixel array substrate, and the vibration generation device is in the second substrate.

36. The display apparatus according to claim 33, wherein the plurality of first portions is arranged in a lattice pattern,
wherein the at least one electrode includes a first electrode on a lower surface of the vibration generation device, and a second electrode on an upper surface of the vibration generation device.

37. The display apparatus according to claim 33, wherein at least one of the plurality of first portions is disposed to extend in a first direction having a first size,
wherein the at least one electrode includes a first electrode on a lower surface of the vibration generation device, and a second electrode on an upper surface of the vibration generation device.

* * * * *